US009899635B2

(12) United States Patent
Bangert et al.

(10) Patent No.: US 9,899,635 B2
(45) Date of Patent: Feb. 20, 2018

(54) SYSTEM FOR DEPOSITING ONE OR MORE LAYERS ON A SUBSTRATE SUPPORTED BY A CARRIER AND METHOD USING THE SAME

(71) Applicant: Applied Materials, Inc., Santa Clara, CA (US)

(72) Inventors: Stefan Bangert, Steinau (DE); Uwe Schüβler, Aschaffenburg (DE); Jose Manuel Dieguez-Campo, Hanau (DE); Dieter Haas, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/113,752

(22) PCT Filed: Feb. 4, 2014

(86) PCT No.: PCT/EP2014/052116
§ 371 (c)(1),
(2) Date: Jul. 22, 2016

(87) PCT Pub. No.: WO2015/117638
PCT Pub. Date: Aug. 13, 2015

(65) Prior Publication Data
US 2017/0244070 A1    Aug. 24, 2017

(51) Int. Cl.
*H01L 51/40*    (2006.01)
*H01L 51/56*    (2006.01)
(Continued)

(52) U.S. Cl.
CPC .......... *H01L 51/56* (2013.01); *C23C 14/042* (2013.01); *C23C 14/12* (2013.01); *C23C 14/243* (2013.01);
(Continued)

(58) Field of Classification Search
CPC ....... H01L 51/50; H01L 51/56; H01L 51/001; H01L 51/0011; C23C 14/04;
(Continued)

(56) References Cited

U.S. PATENT DOCUMENTS 8,870,513 B2 * 10/2014 Voser ................ H01L 21/67201
198/608
2006/0102285 A1 * 5/2006 Bluck ............... H01L 21/67161
156/345.32
(Continued)

FOREIGN PATENT DOCUMENTS

WO    2010021547 A1    2/2010

OTHER PUBLICATIONS

International Search Report and Written Opinion dated Nov. 10, 2014 for Application No. PCT/EP2014/052116.
(Continued)

*Primary Examiner* — Syed Gheyas
(74) *Attorney, Agent, or Firm* — Patterson + Sheridan LLP

(57) ABSTRACT

A system for depositing one or more layers, particularly layers including organic materials therein, is described. The system includes a load lock chamber for loading a substrate to be processed, a transfer chamber for transporting the substrate, a vacuum swing module provided between the load lock chamber and the transfer chamber, at least one deposition apparatus for depositing material in a vacuum chamber of the at least one deposition chamber, wherein the at least one deposition apparatus is connected to the transfer chamber; a further load lock chamber for unloading the substrate that has been processed, a further transfer chamber for transporting the substrate, a further vacuum swing module provided between the further load lock chamber and the further transfer chamber, and a carrier return track from the
(Continued)

further vacuum swing module to the vacuum swing module, wherein the carrier return track is configured to transport the carrier under vacuum conditions and/or under a controlled inert atmosphere.

20 Claims, 15 Drawing Sheets

(51) Int. Cl.
    *C23C 14/04*     (2006.01)
    *C23C 14/12*     (2006.01)
    *C23C 14/24*     (2006.01)
    *C23C 14/50*     (2006.01)
    *C23C 14/56*     (2006.01)
    *H01L 51/00*     (2006.01)

(52) U.S. Cl.
    CPC .......... *C23C 14/505* (2013.01); *C23C 14/566* (2013.01); *C23C 14/568* (2013.01); *H01L 51/001* (2013.01); *H01L 51/0011* (2013.01)

(58) Field of Classification Search
    CPC ....... C23C 14/042; C23C 14/06; C23C 14/12; C23C 14/243; C23C 14/505; C23C 14/566; C23C 14/568; C23C 14/0021
    See application file for complete search history.

(56) References Cited

U.S. PATENT DOCUMENTS

| | | | |
|---|---|---|---|
| 2007/0009652 A1 | 1/2007 | Manz et al. | |
| 2008/0216744 A1* | 9/2008 | Watanabe | C23C 14/352 118/719 |
| 2009/0293810 A1* | 12/2009 | Bangert | C23C 14/243 118/726 |
| 2010/0068375 A1* | 3/2010 | Kawakami | C23C 14/12 427/66 |
| 2012/0064728 A1 | 3/2012 | Yi et al. | |

OTHER PUBLICATIONS

Taiwan Office Action dated Apr. 11, 2017, for Tawian Patent Application No. 104102967.

Taiwan Office Action dated Apr. 11, 2017, for Taiwan Patent Application No. 106101065.

\* cited by examiner

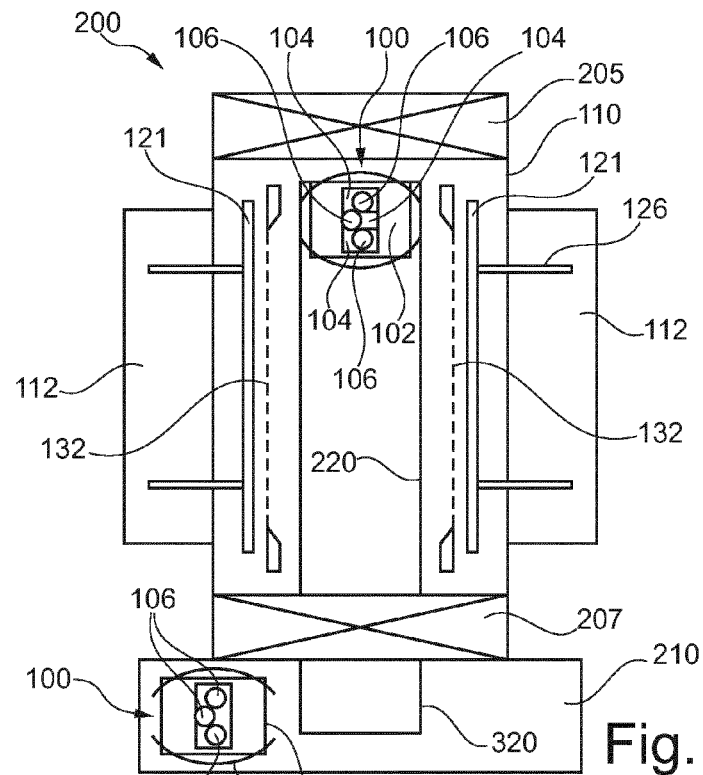
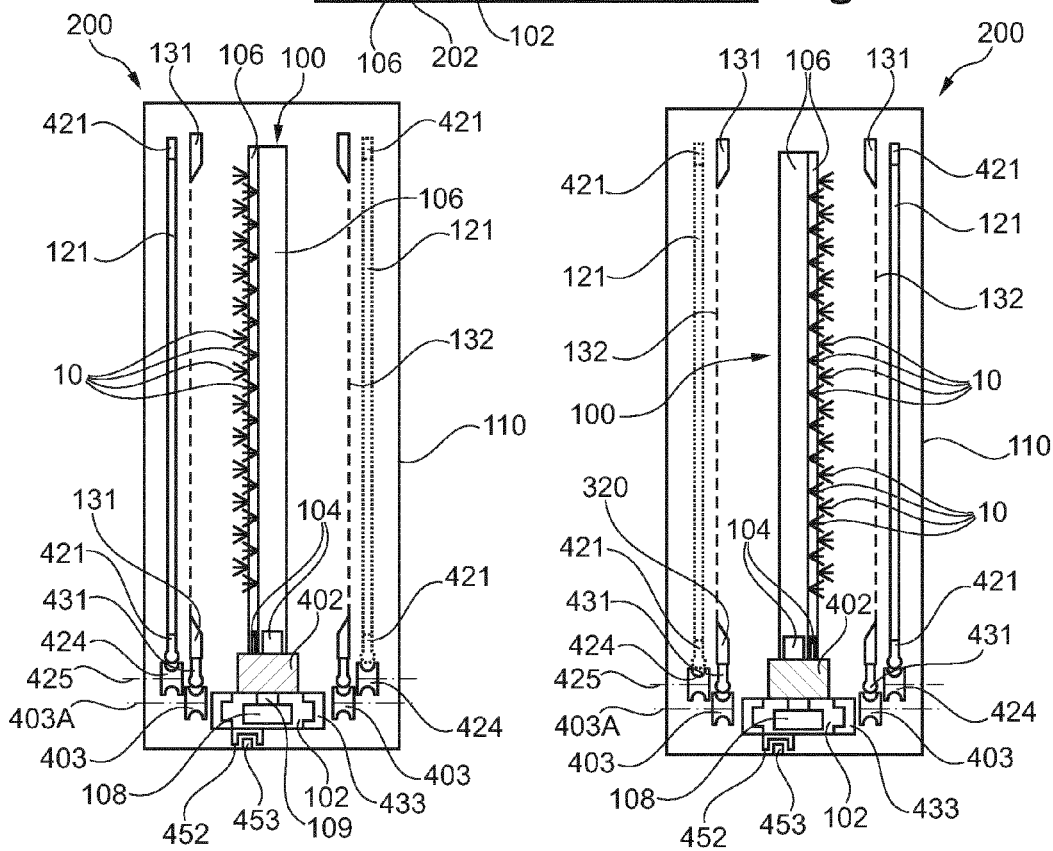
Fig. 3
Fig. 4A    Fig. 4B

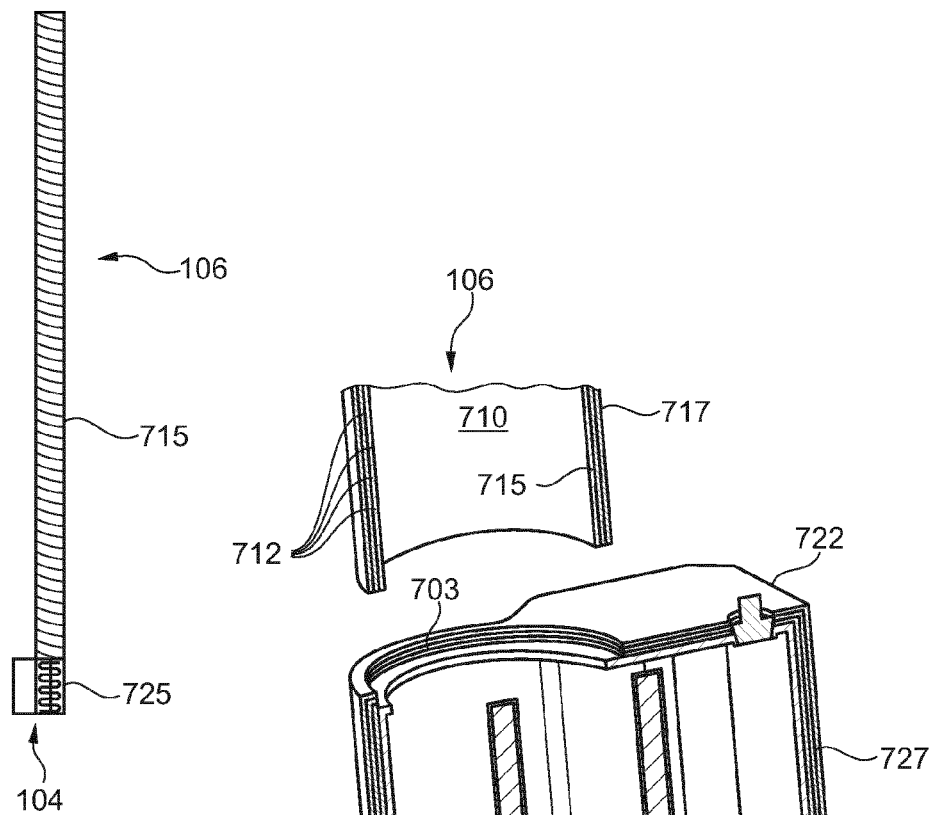
Fig. 7A
Fig. 7B
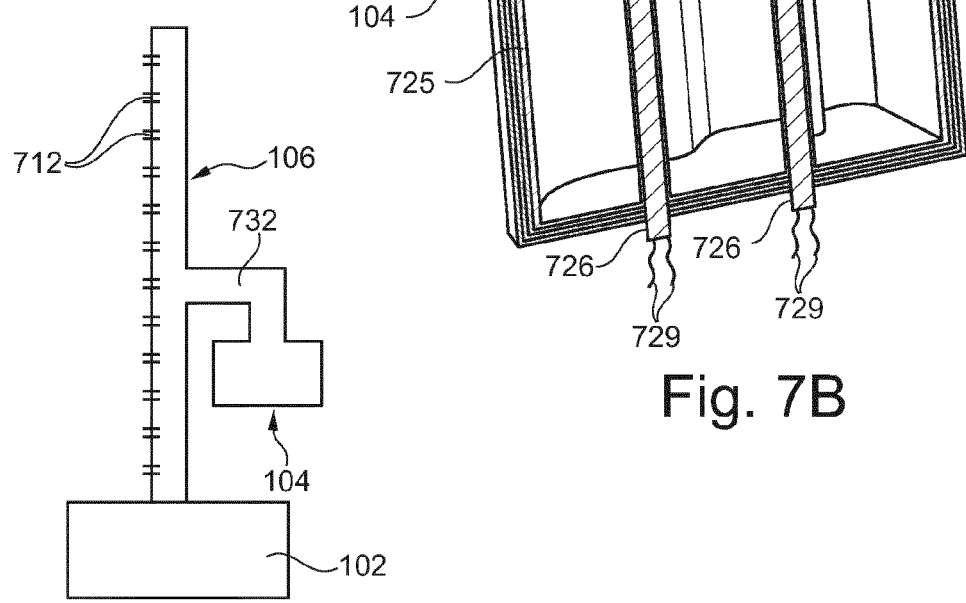
Fig. 7C

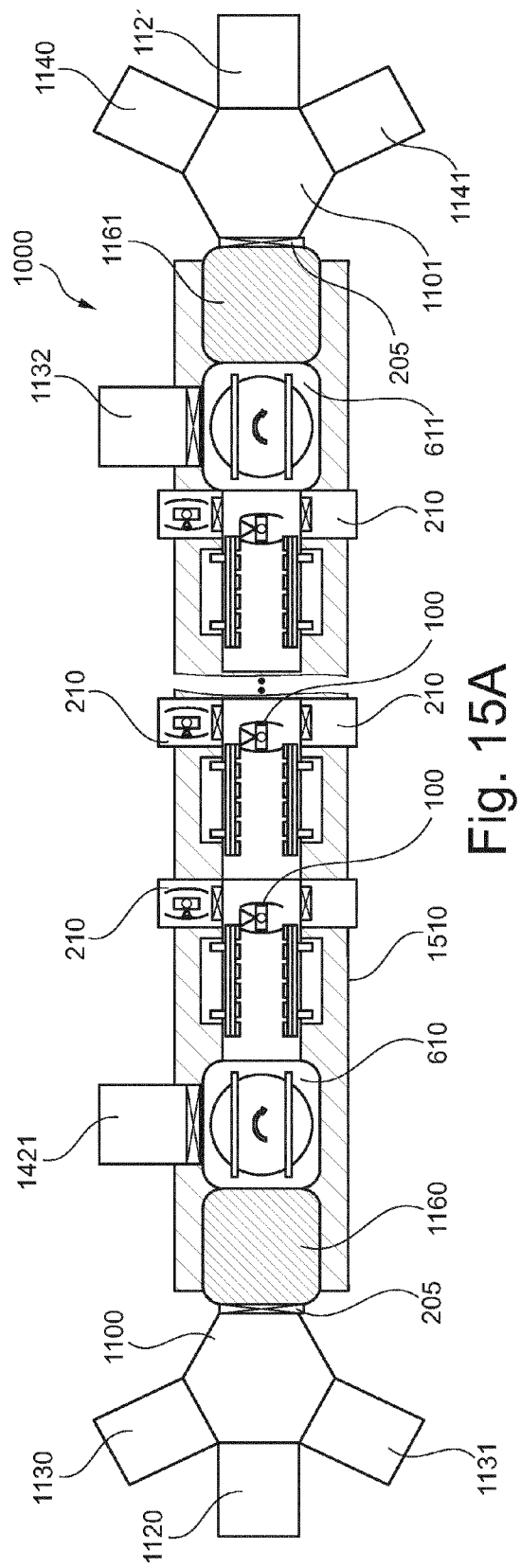
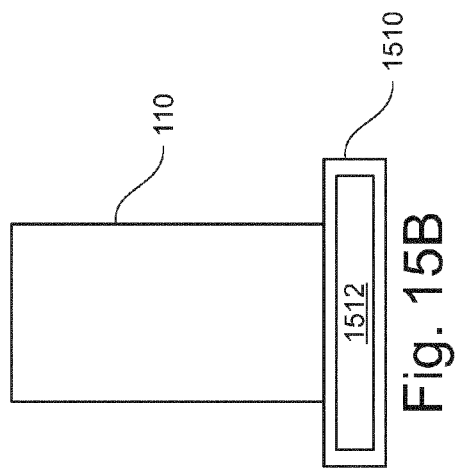
Fig. 15A
Fig. 15B

SYSTEM FOR DEPOSITING ONE OR MORE LAYERS ON A SUBSTRATE SUPPORTED BY A CARRIER AND METHOD USING THE SAME

TECHNICAL FIELD OF THE INVENTION

Embodiments of the present invention relate to deposition of organic material, a system for depositing materials, e.g. organic materials, a source for organic material and deposition apparatuses for organic material. Embodiments of the present invention particularly relate to manufacturing systems for manufacturing devices, particularly devices including organic materials therein, systems for depositing one or more layers, particularly layers including organic materials therein, on a substrate supported by a carrier, methods of manufacturing a device in a manufacturing system for manufacturing devices, particularly devices including organic materials, and methods of depositing one or more layers in a system for depositing one or more layers, particularly layers including organic materials therein, on a substrate supported by a carrier.

BACKGROUND OF THE INVENTION

Organic evaporators are a tool for the production of organic light-emitting diodes (OLED). OLEDs are a special type of light-emitting diodes in which the emissive layer comprises a thin-film of certain organic compounds. Organic light emitting diodes (OLEDs) are used in the manufacture of television screens, computer monitors, mobile phones, other hand-held devices, etc. for displaying information. OLEDs can also be used for general space illumination. The range of colors, brightness, and viewing angle possible with OLED displays are greater than that of traditional LCD displays because OLED pixels directly emit light and do not require a back light. Therefore, the energy consumption of OLED displays is considerably less than that of traditional LCD displays. Further, the fact that OLEDs can be manufactured onto flexible substrates results in further applications. A typical OLED display, for example, may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

There are many challenges encountered in the manufacture of such display devices. In one example, there are numerous labor intensive steps necessary to encapsulate the OLED between the two glass panels to prevent possible contamination of the device. In another example, different sizes of display screens and thus glass panels may require substantial reconfiguration of the process and process hardware used to form the display devices. Generally, there is a desire to manufacture OLED devices on large area substrates.

One step in the manufacturing of large scale OLED displays, which brings various challenges, is the masking of the substrate, e.g. for deposition of patterned layers. Further, known systems typically have a small overall material utilization, e.g. of <50%.

Therefore, there is a continuous need for new and improved systems, apparatuses and methods for forming devices such as OLED display devices.

SUMMARY OF THE INVENTION

In light of the above, an improved system for depositing one or more layers, particularly layers including organic materials therein, on a substrate supported by a carrier and an improved method of depositing one or more layers in a system for depositing one or more layers, particularly layers including organic materials therein, on a substrate supported by a carrier are provided. Further aspects, advantages, and features of embodiments of the present invention are apparent from the dependent claims, the description, and the accompanying drawings.

According to one embodiment, a system for depositing one or more layers, particularly layers including organic materials therein, on a substrate supported by a carrier is provided. The system includes a load lock chamber for loading a substrate to be processed, a transfer chamber for transporting the substrate, a vacuum swing module provided between the load lock chamber and the transfer chamber, at least one deposition apparatus for depositing material in a vacuum chamber of the at least one deposition chamber, wherein the at least one deposition apparatus is connected to the transfer chamber; a further load lock chamber for unloading the substrate that has been processed, a further transfer chamber for transporting the substrate, a further vacuum swing module provided between the further load lock chamber and the further transfer chamber, and a carrier return track from the further vacuum swing module to the vacuum swing module, wherein the carrier return track is configured to transport the carrier under vacuum conditions and/or under a controlled inert atmosphere.

According to another embodiment, a method of depositing one or more layers in a system for depositing one or more layers, particularly layers including organic materials therein, on a substrate supported by a carrier is provided. The method includes loading the substrate in the system in a horizontal orientation, loading the substrate onto a carrier in a vacuum swing module; rotating the substrate in a vertical orientation in the vacuum swing module, transferring the carrier with the loaded substrate through the system and into and out of at least one deposition chamber under vacuum conditions, rotating the carrier in a horizontal orientation in a further vacuum swing module, unloading the substrate from the carrier in the further vacuum swing module in the horizontal orientation, and returning the empty carrier under vacuum conditions and/or under a controlled inert atmosphere from the further vacuum swing module to the vacuum swing module.

According to a further embodiment, a system for depositing one or more layers, particularly layers including organic materials therein, on a substrate supported by a carrier is provided. The system includes a load lock chamber for loading a substrate to be processed in a horizontal orientation, a transfer chamber for transporting the substrate, a vacuum swing module provided between the load lock chamber and the transfer chamber, wherein the vacuum swing module is configured to rotate to substrate from the horizontal orientation to a vertical orientation, at least one deposition apparatus for depositing material in a vacuum chamber of the at least one deposition chamber, wherein the at least one deposition apparatus is connected to the transfer chamber; a further load lock chamber for unloading the substrate that has been processed in a horizontal orientation, a further transfer chamber for transporting the substrate, a further vacuum swing module provided between the further load lock chamber and the further transfer chamber, wherein the vacuum swing module is configured to rotate to substrate from the vertical orientation to a horizontal orientation for unloading in the horizontal orientation, and a carrier return track from the further vacuum swing module to the vacuum swing module, wherein the carrier return track is configured

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 3 shows a schematic top view of another deposition apparatus for depositing organic material in a vacuum chamber according to embodiments described herein;

FIGS. 4A and 4B show schematic side views of a deposition apparatus for depositing organic material in a vacuum chamber according to embodiments described herein and an evaporation source for evaporation of organic material according to embodiments described herein in different deposition positions in a vacuum chamber;

FIGS. 7A and 7B show schematic views of portions of an evaporation source according to embodiments described herein;

FIG. 7C shows a schematic view of another evaporation source according to embodiments described herein;

FIGS. 15A and 15B show a yet further manufacturing system according to embodiments described herein having an in-line deposition system portion and an independent carrier return track similar to FIG. 14;

DETAILED DESCRIPTION OF EMBODIMENTS

Figures 1A, 1B, 1C, 1D:
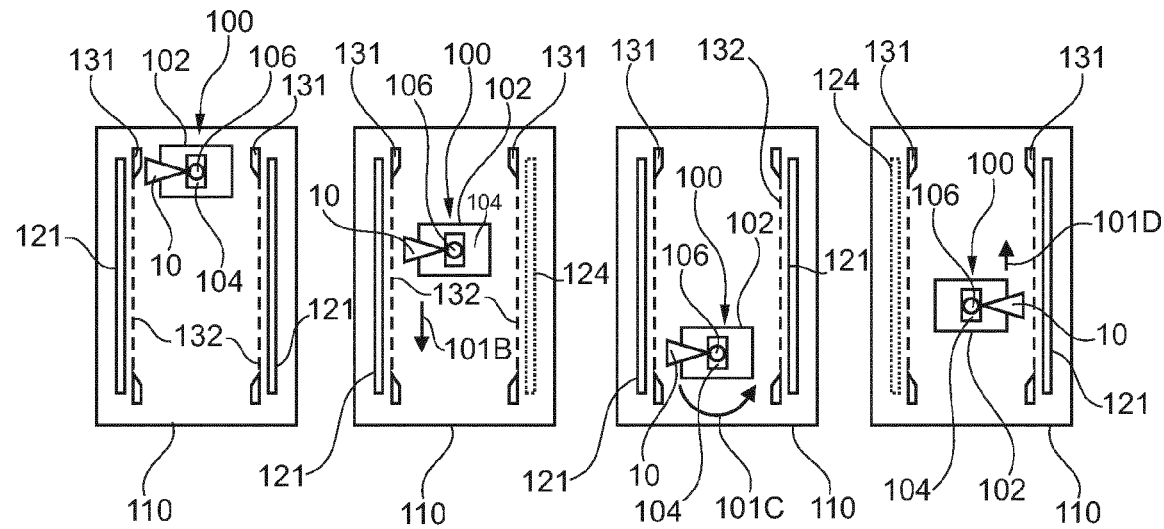
FIGS. 1A to 1D show schematic views illustrating an evaporation source for organic material according to embodiments described herein in different deposition positions in a vacuum chamber of a deposition apparatus according to yet further embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

FIGS. 1A to 1D show an evaporation source 100 in various positions in a vacuum chamber 110. The movement between the different positions is indicated by arrows 101B, 101C, and 101D. According to embodiments described herein, the evaporation source is configured for a translational movement and a rotation around an axis. FIGS. 1A to 1D show the evaporation source 100 having an evaporation crucible 104 and the distribution pipe 106. The distribution pipe 106 is supported by the support 102. Further, according to some embodiments, the evaporation crucible 104 can also be supported by the support 102. Two substrates 121 are provided in the vacuum chamber 110. Typically, a mask 132 for masking of the layer deposition on the substrate can be provided between the substrate and the evaporation source 100. As illustrated in FIGS. 1A to 1D organic material is evaporated from the distribution pipe 106. This is indicated by reference numeral 10.

In FIG. 1A, the evaporation source 100 is shown in the first position. As shown in FIG. 1B the left substrate in the vacuum chamber 110 is deposited with a layer of organic material by a translational movement of the evaporation source as indicated by arrow 101B. While the left substrate 121 is deposited with the layer of organic material, a second substrate, e.g. the substrate on the right-hand side in FIGS.

1A to 1D, can be exchanged. FIG. 1B shows a transportation track 124 for the substrate. After the left substrate 121 has been deposited with the layer of organic material, the distribution pipe 106 of the evaporation source is rotated as indicated by arrow 101C in FIG. 1C. During deposition of the organic material on the first substrate (the substrate on the left-hand side in FIG. 1B), the second substrate has been positioned and aligned with respect to the mask 132. Accordingly, after the rotation shown in FIG. 1C, the substrate on the right-hand side, i.e. the second substrate 121, can be coated with a layer of organic material as indicated by arrow 101D. While the second substrate 121 is coated with the organic material, the first substrate can be moved out of the vacuum chamber 110. FIG. 1D shows a transportation track 124 in the position of the first substrate (the left-hand side in FIG. 1D).

According to embodiments described herein, the substrates are coated with organic material in an essentially vertical position. That is the views shown in FIG. 1A to 1D are top views of an apparatus including the evaporation source 100. Typically, the distribution pipe is a vapor distribution showerhead, particularly a linear vapor distribution showerhead. Thereby, the distribution pipe provides a line source extending essentially vertically. According to embodiments described herein, which can be combined with other embodiments described herein, essentially vertically is understood particularly when referring to the substrate orientation, to allow for a deviation from the vertical direction of 10° or below. This deviation can be provided because a substrate support with some deviation from the vertical orientation might result in a more stable substrate position. Yet, the substrate orientation during deposition of the organic material is considered essentially vertical, which is considered different from the horizontal substrate orientation. The surface of the substrates is thereby coated by a line source extending in one direction corresponding to one substrate dimension and a translational movement along the other direction corresponding to the other substrate dimension.

As shown in FIG. 1C, the rotation of the distribution pipe 106, i.e. the rotation from the first substrate 121 to the second substrate 121, can be 180°. After the second substrate has been deposited as shown in FIG. 1D, the distribution pipe 106 can either be rotated backward by 180° or can be rotated in the same direction as indicated in FIG. 1C. Thereby, the distribution pipe 106 is rotated by 360° in total. According to embodiments described herein, which can be combined with other embodiments described herein, the distribution pipe 106 is the least rotated by 160°, for example, in the case where the evaporation coil indicated by reference numeral 10 is not provided perpendicular to the surface of the substrates 121. However, typically the distribution pipe 106 is rotated by 180° or by at least a 360°.

According to embodiments described herein, a combination of the translational movement of a line source, e.g. a linear vapor distribution showerhead, and the rotation of the line source, e.g. a linear vapor distribution showerhead, allows for a high evaporation source efficiency and a high material utilization for OLED display manufacturing, wherein a high precision of masking of the substrate is desired. A translational movement of the source allows for a high masking precision since the substrate and the mask can maintain stationary. The rotational movement allows for a substrate exchange of one substrate while another substrate is coated with organic material. This significantly improves the material utilization as the idle time, i.e. the time during which the evaporation source evaporates organic material without coating a substrate, is significantly reduced.

Embodiments described herein particularly relate to deposition of organic materials, e.g. for OLED display manufacturing and on large area substrates. According to some embodiments, large area substrates or carriers supporting one or more substrates, i.e. large area carriers, may have a size of at least 0.174 m². Typically, the size of the carrier can be about 1.4 m² to about 8 m², more typically about 2 m² to about 9 m² or even up to 12 m². Typically, the rectangular area, in which the substrates are supported, for which the holding arrangements, apparatuses, and methods according to embodiments described herein are provided, are carriers having sizes for large area substrates as described herein. For instance, a large area carrier, which would correspond to an area of a single large area substrate, can be GEN 5, which corresponds to about 1.4 m² substrates (1.1 m×1.3 m), GEN 7.5, which corresponds to about 4.29 m² substrates (1.95 m×2.2 m), GEN 8.5, which corresponds to about 5.7 m² substrates (2.2 m×2.5 m), or even GEN 10, which corresponds to about 8.7 m² substrates (2.85 m×3.05 m). Even larger generations such as GEN 11 and GEN 12 and corresponding substrate areas can similarly be implemented. According to typical embodiments, which can be combined with other embodiments described herein, the substrate thickness can be from 0.1 to 1.8 mm and the holding arrangement, and particularly the holding devices, can be adapted for such substrate thicknesses. However, particularly the substrate thickness can be about 0.9 mm or below, such as 0.5 mm or 0.3 mm, and the holding arrangement, and particularly the holding devices, are adapted for such substrate thicknesses. Typically, the substrate may be made from any material suitable for material deposition. For instance, the substrate may be made from a material selected from the group consisting of glass (for instance soda-lime glass, borosilicate glass etc.), metal, polymer, ceramic, compound materials, carbon fiber materials or any other material or combination of materials which can be coated by a deposition process.

In order to achieve good reliability and yield rates, embodiments described herein keep the mask and substrate stationary during the deposition of organic material. A movable linear source for uniform coating of a large area substrate is provided. The idle time is reduced as compared to an operation wherein after each deposition the substrate needs to be exchange including a new alignment step of the mask and the substrate relative to each other. During the idle time, the source is wasting material. Accordingly, having a second substrate in a deposition position and readily aligned with respect to the mask reduces the idle time and increases the material utilization.

Figure 2:
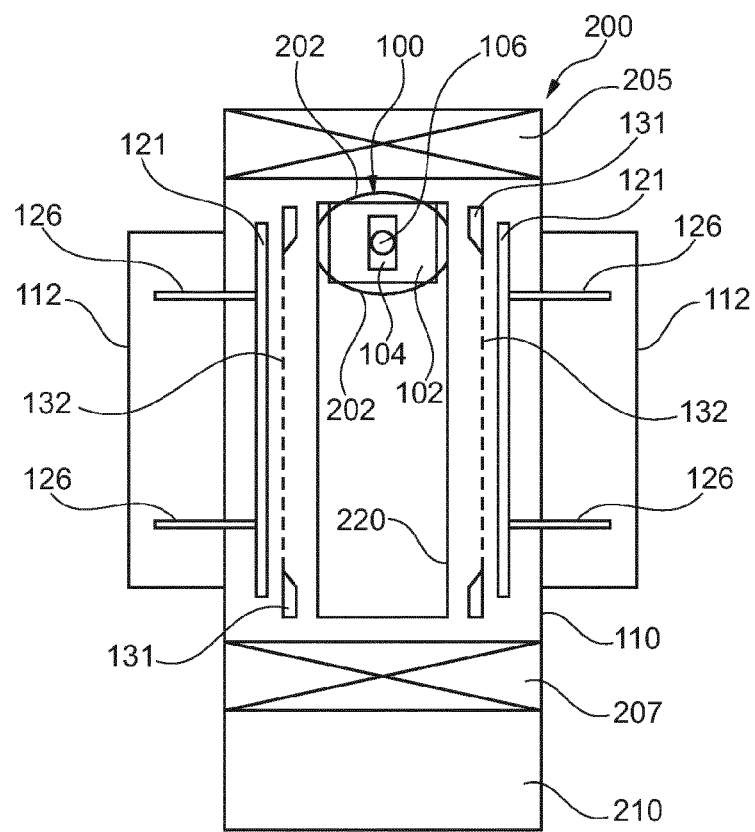
FIG. 2 shows a schematic top view of a deposition apparatus for depositing organic material in a vacuum chamber according to embodiments described herein.

FIG. 2 illustrates an embodiment of a deposition apparatus 200 for depositing organic material in a vacuum chamber 110. The evaporation source 100 is provided in the vacuum chamber 110 on a track or linear guide 220. The linear guide 220 is configured for the translational movement of the evaporation source 100. Thereby, according to different embodiments, which can be combined with other embodiments described herein, a drive for the translational movement can be provided in the evaporation source 100, at the track or linear guide 220, within the vacuum chamber 110 or a combination thereof. FIG. 2 shows a valve 205, for example a gate valve. The valve 205 allows for a vacuum seal to an adjacent vacuum chamber (not shown in FIG. 2). The valve can be opened for transport of a substrate 121 or a mask 132 into the vacuum chamber 110 or out of the vacuum chamber 110.

According to some embodiments, which can be combined with other embodiments described herein, a further vacuum chamber, such as maintenance vacuum chamber 210 is provided adjacent to the vacuum chamber 110. Thereby the vacuum chamber 110 and the maintenance vacuum chamber 210 are connected with a valve 207. The valve 207 is configured for opening and closing a vacuum seal between the vacuum chamber 110 and the maintenance vacuum chamber 210. The evaporation source 100 can be transferred to the maintenance vacuum chamber 210 while the valve 207 is in an open state. Thereafter, the valve can be closed to provide a vacuum seal between the vacuum chamber 110 and the maintenance vacuum chamber 210. If the valve 207 is closed, the maintenance vacuum chamber 210 can be vented and opened for maintenance of the evaporation source 100 without breaking the vacuum in the vacuum chamber 110.

Two substrates 121 are supported on respective transportation tracks within the vacuum chamber 110. Further, two tracks for providing masks 132 thereon are provided. Thereby, coating of the substrates 121 can be masked by respective masks 132. According to typical embodiments, the masks 132, i.e. a first mask 132 corresponding to a first substrate 121 and a second mask 132 corresponding to a second substrate 121, are provided in a mask frame 131 to hold the mask 132 in a predetermined position.

According to some embodiments, which can be combined with other embodiments described herein, a substrate 121 can be supported by a substrate support 126, which is connected to an alignment unit 112. An alignment unit 112 can adjust the position of the substrate 121 with respect to the mask 132. FIG. 2 illustrates an embodiment where the substrate support 126 is connected to an alignment unit 112. Accordingly, the substrate is moved relative to the mask 132 in order to provide for a proper alignment between the substrate and the mask during deposition of the organic material. According to a further embodiment, which can be combined with other embodiments described herein, alternatively or additionally the mask 132 and/or the mask frame 131 holding the mask 132 can be connected to the alignment unit 112. Thereby, either the mask can be positioned relative to the substrate 121 or the mask 132 and the substrate 121 can both be positioned relative to each other. The alignment units 112, which are configured for adjusting the relative position between a substrate 121 and a mask 132 relative to each other, allow for a proper alignment of the masking during the deposition process, which is beneficial for high quality or LED display manufacturing.

Examples of an alignment of a mask and a substrate relative to each other include alignment units, which allow for a relative alignment in at least two directions defining a plane, which is essentially parallel to the plane of the substrate and the plane of the mask. For example, an alignment can at least be conducted in an x-direction and a y-direction, i.e. two Cartesian directions defining the above-described parallel plane. Typically, the mask and the substrate can be essentially parallel to each other. Specifically, the alignment can further be conducted in a direction essentially perpendicular to the plane of the substrate and the plane of the mask. Thus, an alignment unit is configured at least for an X-Y-alignment, and specifically for an X-Y-Z-alignment of the mask and the substrate relative to each other. One specific example, which can be combined with other embodiments described herein, is to align the substrate in x-direction, y-direction and z-direction to a mask, which can be held stationary in the vacuum chamber 110.

As shown in FIG. 2, the linear guide 220 provides a direction of the translational movement of the evaporation source 100. On both sides of the evaporation source 100 a mask 132 is provided. The masks 132 can thereby extend essentially parallel to the direction of the translational movement. Further, the substrates 121 at the opposing sides of the evaporation source 100 can also extend essentially parallel to the direction of the translational movement. According to typical embodiments, a substrate 121 can be moved into the vacuum chamber 110 and out of the vacuum chamber 110 through valve 205. Thereby, and deposition apparatus 200 can include a respective transportation track for transportation of each of the substrates 121. For example, the transportation track can extend parallel to the substrate position shown in FIG. 2 and into and out of the vacuum chamber 110.

Typically, further tracks are provided for supporting the mask frames 131 and thereby the masks 132. Accordingly, some embodiments, which can be combined with other embodiments described herein, can include four tracks within the vacuum chamber 110. In order to move one of the masks 132 out of the chamber, for example for cleaning of the mask, the mask frame 131 and, thereby, the mask can be moved onto the transportation track of the substrate 121. The respective mask frame can then exit or enter the vacuum chamber 110 on the transportation track for the substrate. Even though it would be possible to provide a separate transportation track into and out of the vacuum chamber 110 for the mask frames 131, the costs of ownership of a deposition apparatus 200 can be reduced if only two tracks, i.e. transportation tracks for a substrate, extend into and out of the vacuum chamber 110 and, in addition, the mask frames 131 can be moved onto a respective one of the transportation tracks for the substrate by an appropriate actuator or robot.

FIG. 2 illustrates another exemplary embodiment of the evaporation source 100. The evaporation source 100 includes a support 102. The support 102 is configured for the translational movement along the linear guide 220. The support 102 supports an evaporation crucible 104 and a distribution pipe 106 provided over the evaporation crucible 104. Thereby, the vapor generated in the evaporation crucible can move upwardly and out of the one or more outlets of the distribution pipe. According to embodiments described herein, the distribution pipe 106 can also be considered a vapor distribution showerhead, for example a linear vapor distribution showerhead.

The one or more outlets can be one or more openings or one or more nozzles, which can, e.g., be provided in a showerhead or another vapor distribution system. The evaporation source can include a vapor distribution showerhead, e.g. a linear vapor distribution showerhead having a plurality of nozzles or openings. A showerhead can be understood herein, to include an enclosure having openings such that the pressure in the showerhead is higher than outside of the showerhead, for example by at least one order of magnitude.

FIG. 2 further illustrates a shield assembly having at least one shield 202. Typically, as shown in FIG. 2, embodiments can include two shields 202, e.g. side shields. Thereby, an evaporation of the organic material can be delimited in the direction towards the substrate. An evaporation sideward relative to the distribution pipe, i.e. in a direction that is for example perpendicular to the normal evaporation direction, can be avoided or used in an idle mode only. In light of the fact that it can be easier to block the vapor beam of organic material as compared to switching off the vapor beam of organic material, the distribution pipe 106 may also be rotated towards one of the side shields 202 in order to avoid vapor exiting the evaporation source 100 during an operation mode where vapor emission is not desired.

According to embodiments described herein, which can be combined with other embodiments described herein, the rotation of the distribution pipe can be provided by a rotation of an evaporator control housing, on which at least the distribution pipe is mounted. Typically, also the evaporation crucible is mounted on the evaporator control housing. Accordingly, the evaporation sources include at least the distribution pipe to be rotatably mounted, specifically the distribution pipe and the evaporation crucible to be both, i.e. together, rotatably mounted, and even more specifically, the control housing, distribution pipe and the evaporation crucible to be rotatably mounted together. Typically, the one or more side shields can be mounted fixedly, such that the do not rotate together with the distribution pipe. According to a typical example, as shown in FIGS. 2 and 3, the side shields can be provided such that the vapor outlet opening is provided on two sides of the evaporation source, wherein the two sides face one of the two substrates, respectively. The fixed side shields are thus stationary with respect to the rotation of the distribution pipes around the axis. Yet, the side shields follow the translational movement and are moveable with respect to the translational movement.

FIG. 3 illustrates yet further modifications, which can be combined with other embodiments described herein. Thereby, details, aspects and features, which have already been described with respect to FIG. 2, will be omitted for ease of reference. As compared to FIG. 2, the evaporation source 100 shown in FIG. 3 includes three evaporation crucibles 104 and three distribution pipes 106. For coating a substrate with a layer of organic material, one organic material can be evaporated or two or more organic materials can be evaporated in order to deposit one layer of organic materials. Thereby, the two or more organic materials mix in the vapor state and/or on the surface of the substrate and form one layer of organic material. In light thereof, according to some embodiments, which can be combined with other embodiments described herein, two or more evaporation crucibles 104 and two or more distribution pipes 106 can be supported by the support 102. As described above, the distribution pipes can provide line sources, e.g. as a linear distribution showerhead, and further, the support 102 moves along the linear guide 220 in order to deposit the organic material on the substrate 121.

According to yet further embodiments, which can be combined with other embodiments described herein, the transfer of the evaporation source 100 in the maintenance vacuum chamber 210 can be provided by an elongated portion of the linear guide 220. Thereby, a further linear guide 320 is provided in the maintenance vacuum chamber 210. Yet further, the second evaporation source 100 can be provided in a waiting position in the maintenance vacuum chamber 210. FIG. 3 shows a further evaporation source 100 in a waiting position on the left side of the maintenance vacuum chamber. According to some embodiments of operating the deposition apparatus 200, the evaporation source 100 shown in the vacuum chamber 110 can be moved into the maintenance vacuum chamber 210, for example, when maintenance is desired. For this movement, the valve 207 can be opened. The further evaporation source 100, which is shown in FIG. 3 in the waiting position and which is in a status ready to operate, can be moved into the vacuum chamber 110. Thereafter the valve 207 can be closed and the maintenance vacuum chamber 210 can be vented and opened for maintenance of the first evaporation source 100, which has just been moved in to a waiting position in the maintenance vacuum chamber. Thereby, a quick exchange of evaporation sources is possible. The deposition apparatus 200 has thereby reduced downtime, which generates a significant portion of the costs of ownership of a deposition apparatus as previously know.

Further, the embodiments described herein allow for a stable evaporation rate, e.g. of about ±5% or below on a time scale of one week or above. This can particularly be provided by the improved maintenance conditions. Yet, further according to methods of operating organic material, a refill of organic material in an evaporation crucible can be conducted without breaking vacuum and even without stopping evaporation of a deposition apparatus. The maintenance and refill of one evaporation source can be conducted independent of the operation of another source. This improves the cost of ownership (CoO) as source maintenance and refilling thereof is a bottleneck in many other OLED manufacturing systems. In other words, a high system uptime by having no need to vent the substrate handling or deposition chamber during routine maintenance or during mask exchange can significantly improve the CoO. As described above, one reason for this improvement is the maintenance vacuum chamber and/or other components associated with the maintenance vacuum chamber described herein, wherein maintenance and pre-conditioning of the evaporation source or sources in a separate chamber, which can be evacuated, i.e. the maintenance vacuum chamber or another source storage chamber, is provided.

FIGS. 4A and 4B show a schematic cross-sectional side view of a deposition apparatus 200 for depositing organic material. Thereby, FIG. 4A shows an operation condition, wherein the left substrate 121 in the vacuum chamber 110 is coated with organic material. FIG. 4B shows an operation condition, wherein the right substrate 121 in the vacuum chamber 110 is coated with organic material after the distribution pipes 106 (two distribution pipes can be seen in FIGS. 4A and 4B) have been rotated.

FIGS. 4A and 4B show a first transportation track for a first substrate 121 and the second transportation track for a second substrate 121. A first roller assembly is shown on one side of the vacuum chamber 110 and the second roller assembly is shown on the other side of the vacuum chamber. In FIGS. 4A and 4B a respective roller 424 of the first roller assembly and the second roller assembly are shown. The rollers can rotate around the axis 425 and are driven by a drive system. Typically, the plurality of rollers are rotated by one motor. The substrate 121 is supported in a carrier 421. According to some embodiments, which can be combined with other embodiments described herein, the carrier 421 has a rod at the lower side thereof, which can engage with the roller. Accordingly, according to typical embodiments, which can be combined with other embodiments described herein, the first transportation trek for a first substrate and a second transportation trek for a second substrate are provided. Two further tracks are provided, for example, by respective roller assemblies. FIGS. 4A and 4B show one roller 403 on two sides of the vacuum chamber 110. The further tracks are configured for supporting a mask 132, which can be supported in a mask frame 131. According to exemplary embodiments, the mask frame 131 can have a rod 431 at the lower site thereof for engaging with the rollers 403 of the respective roller assembly.

According to some embodiments, which can be combined with other embodiments described herein, the carrier adapted to use in a processing system includes an electrode assembly and a support base. The electrode assembly is configured to generate an electrostatic chucking force for securing a substrate to the substrate carrier. According to yet further additional or alternative modifications, the support base has a heating/cooling reservoir formed therein. The electrode assembly and the support base form an unitary body configured for transport within a processing system. The carrier can be connectable to supply media in the processing system. A quick disconnect can be coupled to the body and configured to trap a heat regulating medium in the reservoir heating/cooling reservoir when the body is decoupled from a source of heat regulating medium. A quick disconnect can be coupled to apply chucking charge.

According to some embodiments, which can be combined with other embodiments described herein, an actuator or a robot is provided in the vacuum chamber 110 for moving the mask frame 131 from a roller 403 to a roller 424. Thereby, the mask frame and, thus, the mask is provided on a roller assembly providing a transportation track. Accordingly, the mask frame 131 can be moved into the vacuum chamber 110 and out of the vacuum chamber along the transportation track provided by the roller assembly for the substrate.

In FIG. 4A, the substrate 121 on the left-hand side is coated with organic material. This is indicated by reference numeral 10 illustrating vapor of organic material being guided from a plurality of outlet openings or nozzles in the distribution pipes 106. The substrate and the carrier on the right-hand side of the vacuum chamber 110 is shown in FIG. 4A with dotted lines. The dotted lines indicate that the substrate is under transportation into or out of the vacuum chamber 110 or that the substrate and the mask 132 are presently aligned with respect to each other. Typically, the transportation of the substrate to be coated with the organic material and the mask alignment is finished before deposition of the organic material on the substrate on the left-hand side has finished. Thereby, the evaporation source 100 can immediately rotate from a deposition position for the substrate on the left-hand side to a deposition position for the substrate on the right-hand side, which is shown in FIG. 4B.

The evaporation source 100 includes an actuator 108, for example a torque motor, an electric rotor or a pneumatic rotor. The actuator 108 can provide a torque via a vacuum rotation feed-through 109, for example a ferrofluidic feed-through. The actuator 108 is configured to rotate at least the distribution pipes 106 around an axis, which is essentially vertical. The evaporation source includes the support 102, which can, for example, house the actuator 108 and the feed-through 109. According to some embodiments, which can be combined with other embodiments described herein, the evaporation source 100 further includes an evaporator control housing 402. The evaporator control housing 402 can be an atmospheric box, i.e. a box configured to maintain atmospheric pressure therein even when the vacuum chamber 110 is evacuated to a technical vacuum. For example, at least one element selected from the group consisting of: a switch, a valve, a controller, a cooling unit and a cooling control unit can be provided in the evaporator control housing 402. The support 102 further supports the evaporation crucibles 104 and the distribution pipes 106.

According to some embodiments, which can be combined with other embodiments described herein, the support 102 is provided with an engagement to the linear guide 433. The translational movement of the evaporation source can be provided by moving the support 102 within or onto the linear guide 433. Thereby, an actuator, drive, a motor, a drive belt, and/or a drive chain can be provided in the linear guide or in the support 102. According to a yet further alternative, a respective portion of the actuator, drive, the motor, the drive belt, and/or the drive chain can be provided in both of the linear guide and the support.

After the distribution pipes have been rotated from the coating position where the substrate 121 on the left-hand side in the vacuum chamber 110 (see FIG. 1A) is coated to the position where the substrate 121 on the right-hand side in the vacuum chamber 110 is coated with organic material (see FIG. 4B), the evaporation source 100 is moved by a translational movement along the linear guide 433 for depositing the substrate 121 on the right-hand side in the vacuum chamber 110. As indicated by the dotted lines on the left-hand side in FIG. 4B, the first substrate, which has previously been coated with the organic material, is now moved out of the vacuum chamber 110. A new substrate is provided in the processing region in the vacuum chamber 110 on the left-hand side, and the mask 132 and the substrate 121 are aligned with respect to each other. Accordingly, after the substrate 121 on the right-hand side has been coated with the layer of organic material, the distribution pipes 106 can be rotated by actuator 108 to again deposit organic material on the new substrate 121 on the left-hand side.

As described above, embodiments described herein include the translational movement of at least one distribution pipe providing a line source along one dimension of the substrate 121 and rotation of the at least one distribution pipe from a first processing region to a second processing region, wherein each of the first processing region and the second processing region are configured to have a substrate supported therein. For example, the substrates in the processing regions are supported in a carrier, which is in turn provided on a transportation track and/or an actuator for alignment of the substrate position. Typically, the at least one distribution pipe 106 forming a line source extends in an essentially vertical direction, i.e. the line defining the line source extends in an essentially vertical direction, and the axis of rotation of the at least one distribution pipe 106 also extends in essentially the vertical direction. The at least one distribution pipe 106 is configured to be rotated during operation. As can be seen for example with respect to FIGS. 4A and 4B, the direction forming the line source and the direction of the axis of the rotation can be parallel.

According to some embodiments, the evaporation source may include a mechanical signal and/or power transmission to the source, e.g. having a sliding contact. For example, a combination of a linear drive, a vacuum rotation unit and/or a sliding contact can be provided for signal and/or power transmission to the evaporation source. According to yet further embodiments, which can be combined with other embodiments described herein, the evaporation source can include an inductive power transmission and/or an inductive signal transmission. FIGS. 4A and 4B show a first coil arrangement 452 at the evaporation source 100, e.g. at the support 102, and a second coil arrangement 453 in the vacuum chamber 110. Thereby, power and/or a control signal can inductively be transmitted from within the vacuum chamber 110 to the evaporation source 100. For example, the coil arrangement 453 can extend in the vacuum chamber such that the power and/or signal transmission can be provided irrespective of the position of the translational movement. According to different implementations, at least one of the power for evaporation crucible, i.e. the power to evaporate the organic material, the power for the actuator 108, i.e. for rotation of the distribution pipe, a control signal for control of the evaporation, a control signal for control of the rotation of the distribution pipe and a control signal for the translational movement can be provided by the combination of the coil arrangements.

According to typical embodiments, which can be combined with other embodiments described herein, an evaporation source includes at least one evaporation crucible, and at least one distribution pipe, e.g. at least one linear vapor distribution showerhead. However, an evaporation source can include two or three, eventually even four or five evaporation crucibles and corresponding distribution pipes. Thereby, different organic materials can be evaporated in at least two of the several crucibles, such that the different organic materials form one organic layer on the substrate. Additionally or alternatively, similar organic materials can be evaporated in at least two of the several crucibles, such that the deposition rate can be increased. This is particularly true as organic materials can often only be evaporated in a relatively small temperature range (e.g. 20° C. or even below) and the evaporation rate can, thus, not be greatly increased by increasing the temperature in the crucible.

According to embodiments described herein, the evaporation sources, the deposition apparatuses, the methods of operating evaporation sources and/or deposition apparatuses, and the methods of manufacturing evaporation sources and/or deposition apparatuses are configured for a vertical deposition, i.e. the substrate is supported in an essentially vertical orientation (e.g. vertical +−10°), during layer deposition. Further, a combination of a line source, a translational movement and a rotation of the evaporation direction, particularly a rotation around an axis being essentially vertical, e.g. parallel to the substrate orientation and/or the direction of the line-extension of the line source, allows for a high material utilization of about 80% or above. This is an improvement of at least 30% as compared to other systems.

A movable and turnable evaporation source within the process chamber, i.e. the vacuum chamber for layer deposition therein, allows for a continuous or almost continuous coating with high material utilization. Generally, embodiments described herein allow for a high evaporation source efficiency (>85%) and a high material utilization (at least 50% or above) by using a scanning source approach with 180° turning mechanism to coat two substrates alternating. Thereby, the source efficiency takes into consideration material losses occurring due to the fact that the vapor beams extend over the size of the large area substrates in order to allow for a uniform coating of the entire area of the substrate which is to be coated. The material utilization additionally considers losses occurring during idle times of the evaporation source, i.e. times where the evaporation source cannot deposit the evaporated material on a substrate.

Yet further, the embodiments described herein and relating to a vertical substrate orientation allow for a small footprint of deposition apparatuses and specifically deposition systems including several deposition apparatuses for coating several layers of organic material on a substrate. Thereby, it can be considered that apparatuses described herein are configured for large area substrate processing or processing of a plurality of substrates in large area carriers. The vertical orientation further allows for a good scalability for current and future substrate size generations, that is present and future glass sizes.

Figure 5A:
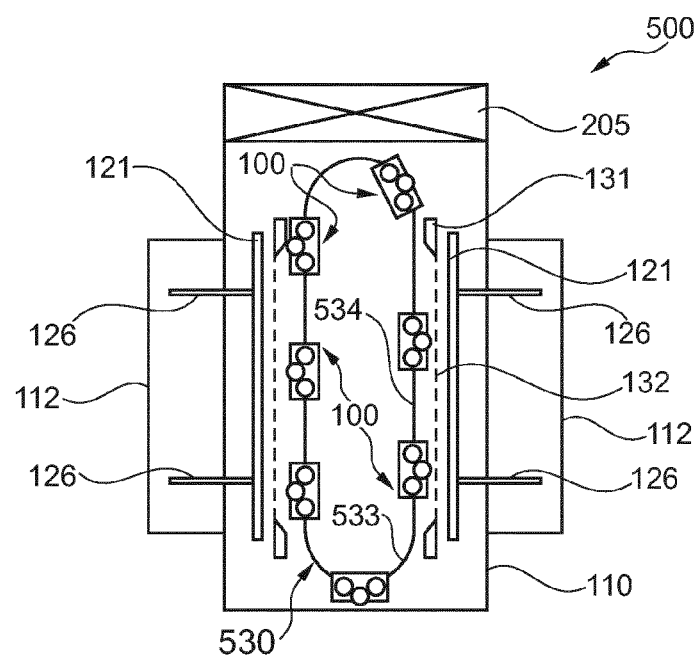
FIGS. 5A and 5B show schematic views of a deposition apparatus for depositing organic material in a vacuum chamber according to embodiments described herein and evaporation sources for evaporation of organic material according to embodiments described herein in different deposition positions in a vacuum chamber.
Figure 5B:
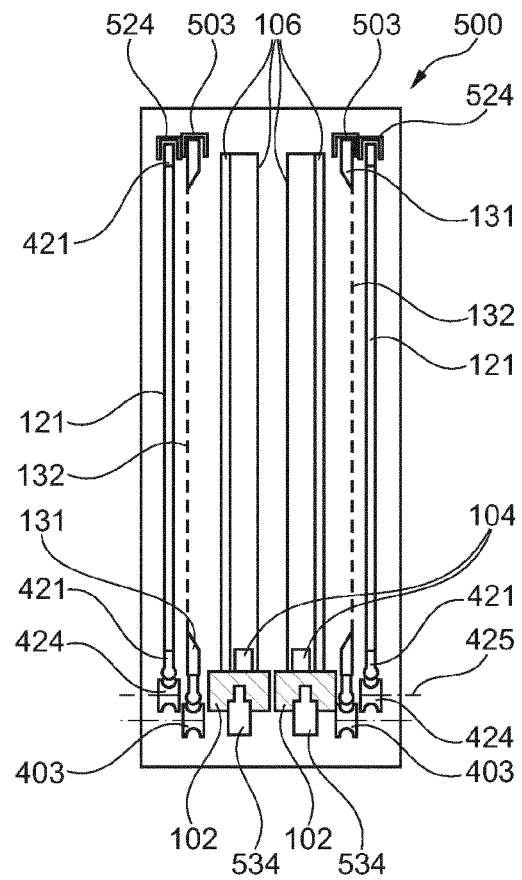

FIGS. 5A and 5B show a yet further embodiment of deposition apparatus 500. FIG. 5A shows a schematic top view of the deposition apparatus 500. FIG. 5B shows a schematic cross-sectional side view of the deposition apparatus 500. The deposition apparatus 500 includes a vacuum chamber 110. The valve 205, for example a gate valve, allows for a vacuum seal to an adjacent vacuum chamber. The valve can be open for transport of a substrate 121 or a mask 132 into the vacuum chamber 110 or out of the vacuum chamber 110. Two or more evaporation sources 100 are provided in the vacuum chamber 110. The example shown in FIG. 5A shows seven evaporation sources. According to typical embodiments, which can be combined with other embodiments described herein, to evaporation sources, three evaporation sources, or four evaporation sources can beneficially be provided. As compared to a higher number of evaporation sources, which may also be provided according to some embodiments, the logistic of maintenance of the limited number of evaporation sources (e.g. 2 to 4) might be easier. Accordingly, the cost of ownership might be better for such systems.

According to some embodiments, which can be combined with other embodiments described herein, and as for example shown in FIG. 5A, the looped track 530 can be provided. The looped track 530 can include straight portions 534 and curved portions 533. The looped track 530 provides for a translational movement of the evaporation sources and the rotation of the evaporation sources. As described above, the evaporation sources can typically be line sources, e.g. linear vapor distribution showerheads.

According to some embodiments, which can be combined with other embodiments described herein, the looped track includes a rail or a rail arrangement, a roller arrangement or a magnetic guide to move the one or more evaporation sources along the looped track.

Based upon the looped track 530, a train of sources can move with translational movement along a substrate 121, which is typically masked by a mask 132. The curved portion 533 of the looped track 530 provides a rotation of the evaporation source 100. Further, the curved portion 533 can provide for positioning the evaporation source in front of a second substrate 121. The further straight portion 534 of the looped track 530 provides a further translational movement along the further substrate 121. Thereby, as mentioned above, according to some embodiments, which can be combined with other embodiments described herein, the substrates 121 and the masks 132 remain essentially stationary during deposition. The evaporation sources providing line sources, e.g. line sources with an essentially vertical orientation of the line, are moved along the stationary substrates.

According to some embodiments, which can be combined with other embodiments described herein, a substrate 121 shown in vacuum chamber 110 can be supported by a substrate support having rollers 403 and 424 and further, in a stationary deposition position, by a substrate support 126, which are connected to alignment units 112. An alignment unit 112 can adjust the position of the substrate 121 with respect to the mask 132. Accordingly, the substrate can be moved relative to the mask 132 in order to provide for a proper alignment between the substrate and the mask during deposition of the organic material. According to a further embodiment, which can be combined with other embodiments described herein, alternatively or additionally the mask 132 and/or the mask frame 131 holding the mask 132 can be connected to the alignment unit 112. Thereby, either the mask can be positioned relative to the substrate 121 or the mask 132 and the substrate 121 can both be positioned relative to each other.

The embodiment shown in FIGS. 5A and 5B shows two substrates 121 provided in the vacuum chamber 110. Yet, particularly for embodiments including a train of evaporation sources 100 in a vacuum chamber at least three substrates or at least four substrates can be provided. Thereby, sufficient time for exchange of the substrate, i.e. transport of a new substrate into the vacuum chamber and of a processed substrate out of the vacuum chamber, can be provided even for a deposition apparatus 500 having a larger number of evaporation sources and, thus, a higher throughput.

FIGS. 5A and 5B show the first transportation track for a first substrate 121 and a second transportation track for a second substrate 121. A first roller assembly is shown on one side of the vacuum chamber 110. The first roller assembly includes rollers 424. Further, the transportation system includes a magnetic guiding element 524. Similarly a second transportation system having rollers and a magnetic guiding element is provided on the opposing side of the vacuum chamber. The transportation system can be operated as, for example, described with respect to FIGS. 4 and 4B. The upper portions of the carriers 421 are guided by magnetic guiding elements 524. Similarly, according to some embodiments, the mask frames 131 can be supported by rollers 403 and magnetic guiding elements 503.

FIG. 5B exemplarily shows two supports 102 provided on a respective straight portion 534 of the looped track 530. Evaporation crucibles 104 and distribution pipes 106 are supported by the respective supports 102. Thereby, FIG. 5B illustrates two distribution pipes 106 supported by a support 102. The supports 102 are shown as being guided on the straight portions 534 of the looped track. According to some embodiments, which can be combined with other embodiments described herein, an actuator, a drive, a motor, a drive belt, and/or a drive chain can be provided to move the support 102 to along the looped track, i.e. along that straight portions 534 of the looped track and along the curved portion 533 (see FIG. 5A) of the looped track.

Figure 6:
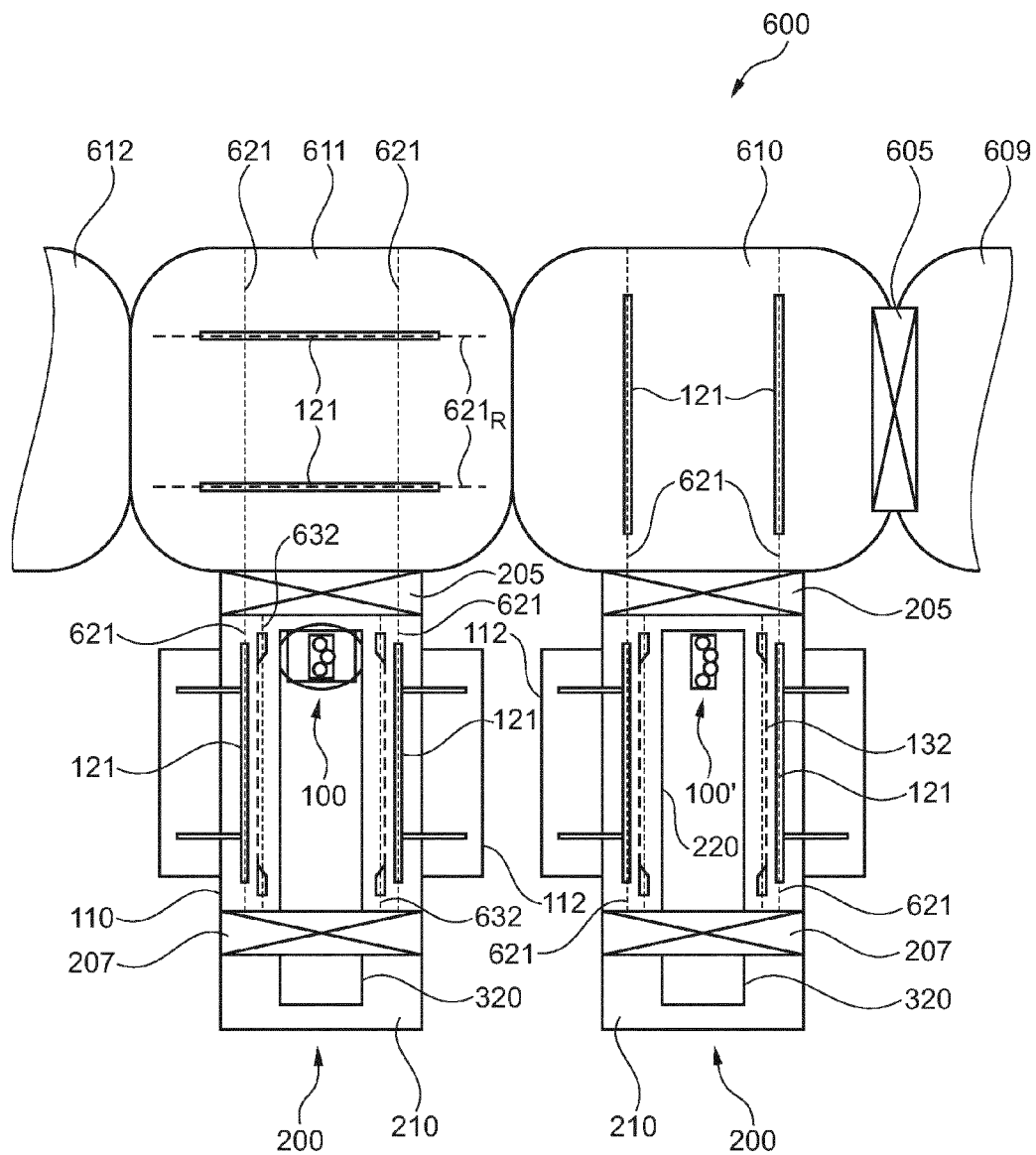
FIG. 6 shows a schematic view of a system having at least two deposition apparatuses and evaporation sources for evaporation of organic material according to embodiments described herein.

FIG. 6 shows an embodiment of the deposition system 600 having a first deposition apparatus 200 and a second deposition apparatus 200. According to embodiments described herein, which can be combined with other embodiments described herein, one or more transfer chambers are provided. FIG. 6 exemplarily shows a first transfer chamber 610 and a second transfer chamber 611. Further, portions of transfer chambers 609 and 612 are shown. As shown in FIG. 6, the gate valve 605 is provided between transfer chamber 610 and transfer chamber 609. The gate valve 605 can be closed or opened to provide a vacuum seal between the transfer chamber 610 and the transfer chamber 609. According to some embodiments, which can be combined with other embodiments described herein, one or more gate valves can be provided between two adjacent transfer chambers. The existence of a gate valve 605 depends on the application of the deposition system 600, i.e. on the kind, number, and/or sequence of layers of organic material deposited on a substrate. Accordingly, one or more gate valve 605 can be provided between transfer chambers. Alternatively, no gate valve is provided between any of the transfer chambers.

According to some embodiments, which can be combined with other embodiments described herein, one or more of the transfer chambers can be provided as the vacuum rotation chamber. Therein, the substrate 121 can be rotated around a central axis, e.g. vertical central axis. Thereby, the orientation of the transportation tracks 621 can be varied. As illustrated in transfer chamber 611, the two substrates 121 are rotated. The two transportation tracks 621R, on which the substrate 121 are located, are rotated with respect to the two transportation tracks 621, which extend from the transportation tracks 621 of the deposition apparatus 200. In light thereof, two substrates 121 on the transportation tracks 621R are provided in a position to be transferred to an adjacent transfer chamber 610 or 612, respectively.

The first deposition apparatus 200 is connected to the first transfer chamber 610 by valve 205. As shown in FIG. 6, and according to some embodiments, which can be combined with other embodiments described herein, the transportation tracks 621 extend from the vacuum chamber 110 into the transfer chamber 610. Thereby, one or more of the substrates 121 can be transferred from the vacuum chamber 110 to the transfer chamber 610. Thereby, the valve 205 is typically opened for transportation of the one or more substrates. A further deposition apparatus 200 is connected to the second transfer chamber 611 by a further valve 205. Accordingly, the substrate can be transferred from one deposition apparatus to a transfer chamber, from the transfer chamber to a further transfer chamber, and from the further transfer chamber to a further deposition apparatus. Thereby, several layers of organic material can be deposited on the substrate without exposing the substrate to atmosphere, and non-vacuum conditions, and/or an undesired environment. According to typical embodiments, which can be combined with other embodiments described herein, the transfer chambers are vacuum transfer chambers, which are, for example, configured for transferring one or more substrates under a vacuum condition and/or desired environment.

The deposition apparatus 200 shown in FIG. 6 are similar or comparable to the deposition apparatus described with respect to FIG. 3. Aspects, details, and features described for the position apparatuses herein, can also be provided for the deposition system 600 as exemplarily shown in FIG. 6. According to some embodiments, which can be combined with other embodiments described herein, an evaporation source 100' can be provided in a deposition apparatus 200. The evaporation source 100' includes four distribution pipes, which are configured to guide organic material on the substrate 121. Thereby, different organic materials can be evaporated in at least two of four crucibles, such that different organic materials form one organic layer on the substrate. Additionally or alternatively, similar organic materials can be evaporated in at least two of four crucibles, such that the deposition rate can be increased. The respective materials evaporated in the four evaporation crucibles are guided towards a substrate 121 by the respective one of the four distribution pipes shown in FIG. 6. According to yet further embodiments, which can be combined with other embodiments described herein, side shields as, for example, shown with respect to FIG. 2 and three can be omitted according to some embodiments. This is exemplarily shown for the evaporation source 100'.

As described above, according to some embodiments, which can be combined with other embodiments described herein, the substrate 121 can be moved out of the vacuum chamber 110 along a first direction. Thereby, the substrate 121 is moved along an essentially straight path into an adjacent vacuum chamber, for example, a transfer chamber. In the transfer chamber, the substrate can be rotated such that the substrate can be moved along a second straight path in a second direction different from the first direction. According to typical embodiments, the second direction is substantially perpendicular to the first direction. This allows for an easy design of a deposition system. For loading of the substrate in a vacuum chamber 110, the substrate can be moved in the transfer chamber along the second direction and can be rotated therein. Thereafter, the substrate can be moved into the vacuum chamber 110 along the first direction, which is different from the second direction.

FIGS. 7A to 7C show portions of the evaporation source, which can be utilized according to embodiments described herein. An evaporation source can include a distribution pipe 106 and an evaporation crucible 104 as shown in FIG. 7A. Thereby, for example, that distribution pipe can be an elongated cube with heating unit 715. The evaporation crucible can be a reservoir for the organic material to be evaporated with a heating unit 725. According to typical embodiments, which can be combined with other embodiments described herein, distribution pipe 106 provides a line source. For example, a plurality of openings and/or nozzles are arranged along at least one line. According to an alternative embodiment, one elongated opening extending along the at least one line can be provided. For example, the elongated opening can be a slit. According to some embodiments, which can be combined with other embodiments described herein the line extends essentially vertically. For example, the length of the distribution pipe 106 corresponds at least to the height of the substrate to be deposited in the deposition apparatus. In many cases, the length of the distribution pipe 106 will be longer than the height of the substrate to be deposited, at least by 10% or even 20%. Thereby, a uniform deposition at the upper end of the substrate and/or the lower end of the substrate can be provided.

According to some embodiments, which can be combined with other embodiments described herein, the length of the distribution pipe can be 1.3 m or above, for example 2.5 m or above. According to one configuration, as shown in FIG. 7A, the evaporation crucible 104 is provided at the lower end of the distribution pipe 106. The organic material is evaporated in the evaporation crucible 104. The vapor of organic material enters the distribution pipe 106 at the bottom of the distribution pipe and is guided essentially sidewardly through the plurality of openings in the distribution pipe, e.g. towards an essentially vertical substrate. For illustrative purposes, that evaporation crucible 104 and the distribution pipe 106 is shown without heat shields in FIG. 7A. Thereby, the heating unit 715 and the heating unit 725 can be seen in the schematic perspective view shown in FIG. 7A.

FIG. 7B shows an enlarged schematic view of a portion of the evaporation source, wherein the distribution pipe 106 is connected to the evaporation crucible 104. A flange unit 703 is provided, which is configured to provide a connection between the evaporation crucible 104 and the distribution pipe 106. For example the evaporation crucible and the distribution pipe are provided as separate units, which can be separated and connected or assembled at the flange unit, e.g. for operation of the evaporation source.

The distribution pipe 106 has an inner hollow space 710. A heating unit 715 is provided to heat the distribution pipe. Accordingly, the distribution pipe 106 can be heated to a temperature such that the vapor of the organic material, which is provided by the evaporation crucible 104, does not condense at an inner portion of the wall of the distribution pipe 106. A shield 717 is provided around the tube of the distribution pipe 106. The shield is configured to reflect heat energy provided by the heating unit 715 back towards the hollow space 710. Thereby, the energy required to heat the distribution pipe, i.e. the energy provided to the heating unit 715, can be reduced because the shield 717 reduces heat losses. According to some embodiments, which can be combined with other embodiments described herein the shield 717 can include one heat shield layer. Alternatively two or more heat shield layers can be provided within the heat shield 717.

Typically, as shown in FIG. 7B, the heat shield 717 includes openings at positions of the opening 712 in the distribution pipe 106. The enlarged view of evaporation source shown in FIG. 7B shows four openings 712. The openings 712 are provided along a line, which is essentially parallel to the axis of the distribution pipe 106. As described herein, the distribution pipe 106 can be provided as a linear distribution showerhead, for example, having a plurality of openings disposed therein. Thereby, a showerhead as understood herein has an enclosure, hollow space, or pipe, in which the material can be provided or guided, for example from the evaporation crucible. The showerhead can have a plurality of openings (or an elongated slit) such that the pressure within the showerhead is higher than outside of the showerhead. For example, the pressure within the showerhead can be at least one order of magnitude higher than outside of the showerhead.

Curing operation, the distribution pipe 106 is connected to the evaporation crucible 104 at the flange unit 703. The evaporation crucible 104 is configured to receive the organic material to be evaporated and to evaporate the organic material. FIG. 7B shows a cross-section through the housing of the evaporation crucible 104. A refill opening is provided, for example at an upper portion of the evaporation crucible, which can be closed using a plug 722, a lid, a cover or the like for closing the enclosure of evaporation crucible 104.

An outer heating unit 725 is provided within the enclosure of the evaporation crucible 104. The outer heating element can extend at least along a portion of the wall of the evaporation crucible 104. According to some embodiments, which can be combined with other embodiments described herein, one or more central heating elements 726 can additionally or alternatively be provided. FIG. 7B shows two central heating elements 726. The central heating elements 726 can include conductors 729 for providing electrical power to the central heating elements. According to some implementations, the evaporation crucible 104 can further include a shield 727. The shield 727 can be configured to reflect heat energy, which is provided by the outer heating unit 725 and, if present, the central heating elements 726, back into the enclosure of the evaporation crucible 104. Thereby, efficient heating of the organic material within the evaporation crucible 104 can be provided.

According to some embodiments, which have been described herein, heat shields such as shield 717 and shield 727 can be provided for the evaporation source. The heat shields can reduce energy losses of the evaporation source. Thereby, energy consumption can be reduced. However, as a further aspect, particularly for deposition of organic materials, heat radiation originating from the evaporation source can be reduced, particularly heat radiation towards the mask and the substrate during deposition. Particularly for deposition of organic materials on masked substrates, and even more for display manufacturing, the temperature of the substrate and the mask needs to be precisely controlled. Thus, heat radiation originating from the evaporation source can be reduced or avoided. Accordingly, some embodiments described herein include heat shields such as shield 717 and shield 727.

These shields can include several shielding layers to reduce the heat radiation to the outside of the evaporation source. As a further option, the heat shields may include shielding layers which are actively cooled by a fluid, such as air, nitrogen, water or other appropriate cooling fluids. According to yet further embodiments, which can be combined with other embodiments described herein, the one or more heat shields provided for the evaporation source can include sheet metals surrounding the respective portions of the evaporation sources, such as the distribution pipe 106 and/or the evaporation crucible 104. For example, the sheet metals can have thicknesses of 0.1 mm to 3 mm, can be selected from at least one material selected from the group consisting of ferrous metals (SS) and non-ferrous metals (Cu, Ti, Al), and/or can be spaced with respect to each other, for example by a gap of 0.1 mm or more.

According to some embodiments, as exemplarily shown with respect to FIGS. 7A to 7B, the evaporation crucible 104 is provided at a lower side of the distribution pipe 106. According to yet further embodiments, which can be combined with other embodiments described herein, a vapor conduit 732 can be provided to the distribution pipe 106 at the central portion of the distribution pipe or at another position between the lower end of the distribution pipe and the upper end of the distribution pipe. FIG. 7C illustrates an example of the evaporation source having a distribution pipe 106 and a vapor conduit 732 provided at a central portion of the distribution pipe. Vapor of organic material is generated in the evaporation crucible 104 and is guided through the vapor conduit 732 to the central portion of the distribution pipes 106. The vapor exits the distribution pipe 106 through a plurality of openings 712. The distribution pipe 106 is supported by a support 102 as described with respect to other embodiments described herein. According to yet further embodiments, which can be combined with other embodiments described herein, two or more vapor conduits 732 can be provided at different positions along the length of the distribution pipe 106. Thereby, the vapor conduits 732 can either be connected to one evaporation crucible 104 or to several evaporation crucibles 104. For example, each vapor conduit 732 can have a corresponding evaporation crucible 104. Alternatively, the evaporation crucible 104 can be in fluid communication with two or more vapor conduits 732, which are connected to the distribution pipe 106.

As described herein, the distribution pipe can be a hollow cylinder. Thereby, the term cylinder can be understood as commonly accepted as having a circular bottom shape and a circular upper shape and a curved surface area or shell connecting the upper circle and the little lower circle. According to further embodiments, which can be combined with other embodiments described herein, the term cylinder can further be understood in the mathematical sense having an arbitrary bottom shape and an identical upper shape and a curved surface area or shell connecting the upper shape and the lower shape. Accordingly, the cylinder does not necessarily need to have a circular cross-section. Instead, the base surface and the upper surface can have a shape different from a circle.

Figure 8A:
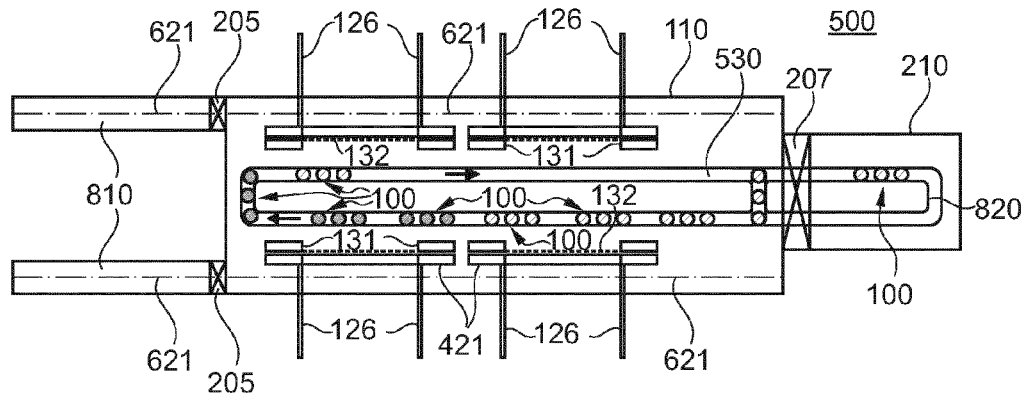
FIGS. 8A and 8B show schematic views of a deposition apparatus for depositing organic material in a vacuum chamber according to embodiments described herein and evaporation sources for evaporation of organic material according to embodiments described herein in different deposition positions in a vacuum chamber.
Figure 8B:
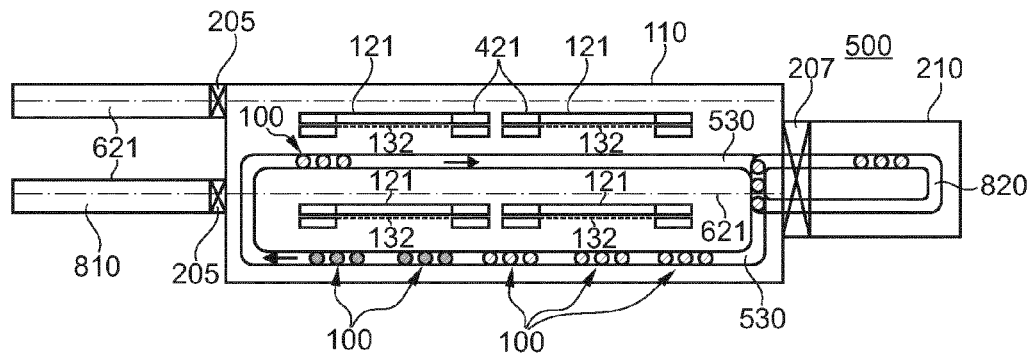
Figure 9:
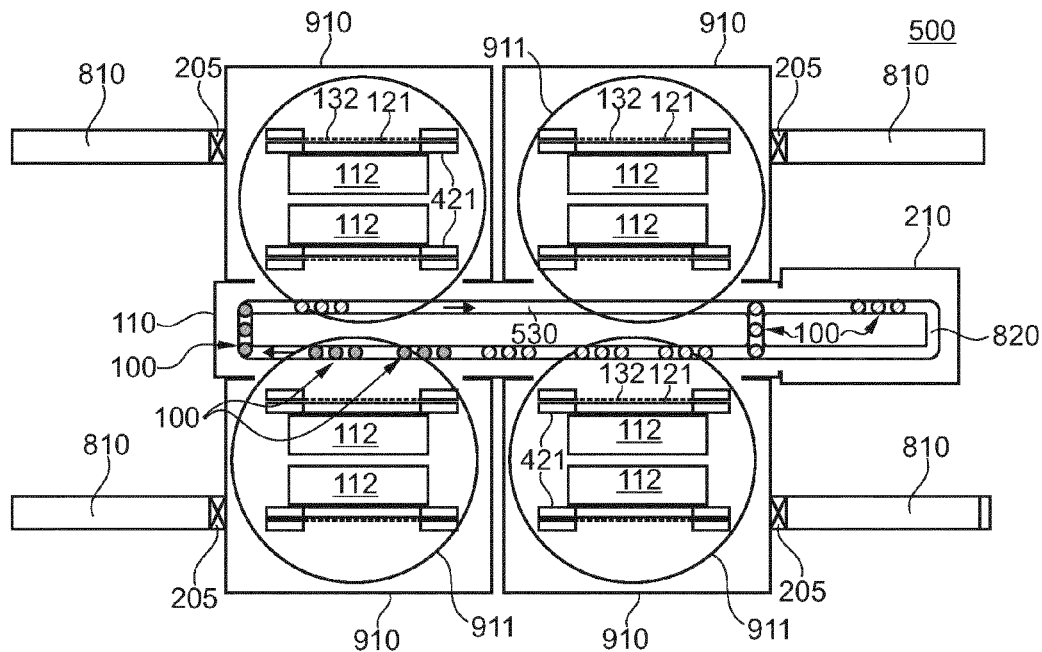
FIG. 9 shows a schematic view of another deposition apparatus for depositing organic material in a vacuum chamber according to embodiments described herein.

As described with respect to FIGS. 5A and 5B, embodiments having a train of evaporation sources and/or embodiments having a looped track for a translational and rotational movement of evaporation sources can benefit from having more than 2 substrates provided in the vacuum chamber. Different embodiments providing more than 2 substrates within the vacuum chamber 110 are illustrated in FIGS. 8A, 8B and FIG. 9. As for example shown in FIG. 8A, the vacuum chamber 110 may include for positions or processing regions, in which a substrate 121 can be processed, for example in which organic material can be deposited on a substrate 121. Thereby, according to some embodiments, which can be combined with other embodiments described herein, exchange of substrates can be accelerated in order to increase the throughput, particularly for a deposition apparatus 500 in which plurality of evaporation sources are provided. The deposition apparatus 500 shown in FIG. 8A includes two transfer chambers 810. Each of the transfer chambers is provided adjacent to the vacuum chamber 110. For example, the transfer chambers 810 can be connected to the vacuum chamber 110 via the valve 205. As described with respect to other embodiments shown herein, one transfer chamber can be provided instead of the two transfer chambers 810 shown in FIG. 8A.

A transportation track 621 is provided in the transfer chambers 810. The transportation track 621 extends into the vacuum chamber 110. According to some embodiments, which can be combined with other embodiments described herein, the transportation track can be defined by an arrangement of rollers, an arrangement of magnetic guiding elements, and/or other transportation elements configured for an essentially linear movement of the substrate and/or a carrier having a substrate, wherein the substrate is typically essentially vertically orientated. As shown in FIG. 8A, substrate supports 126 can be provided, which support the substrates, for example by supporting a carrier 421 having a substrate disposed therein. According to some embodiments, which can be combined with other embodiments described herein, the substrates 121 can be provided in the processing position, which is naturally offset from the transportation track 621. For example, the substrates 121 can be moved in a direction essentially perpendicular to that direction of the transportation track 621 for positioning a substrate into or out of the processing position.

Four substrates 121 are provided in the vacuum chamber 110, wherein two substrates can be positioned along a line, which is essentially parallel to the direction of the transportation track 621. Accordingly, two substrates are positioned along a first line and two substrates along a second line. The looped track 530 for moving a plurality of evaporation sources 100 is provided between the first line and the second line. According to some embodiments, the looped track can include two straight portions and two curved portions. The two straight portions can be essentially parallel to the first line and/or essentially parallel to the substrates 121. The evaporation sources 100 can be moved along the straight portions of the looped track 530 to provide a translational movement for the position of organic material on the substrate, e.g. with a linear distribution showerhead. The evaporation sources 100 are rotated by movement of the evaporation sources along the curved portions of the looped track. Thereby, the direction at which the vapor of organic material is guided by the distribution pipes of the evaporation sources is rotated e.g. by 180°. Accordingly, the distribution pipe of an evaporation source is rotatable by at least 160°.

According to some embodiments, which can be combined with other embodiments described herein, a mask 132, which can for example be supported by a mask frame 131, is provided between the first line defined by substrate positions and the looped track 530 or the second line defined by the further substrates positions and the looped track 530, respectively. The looped track 530 allows for a translational movement of the plurality of evaporation sources 100 along the substrates, which are masked by the masks 132. According to some embodiments, which can be combined with other embodiments described herein, two or more evaporation sources 100 are provided on the looped track 530. For example, FIG. 8A shows eight evaporation sources 100 provided on the looped track 530. The two or more evaporation sources can be transported across the substrates with a translational movement one after the other. Thereby, for example, each of the evaporation sources 100 can deposit one layer of organic material. Accordingly, several different layers of organic material can be deposited on the substrate, which is provided in the processing position. According to some embodiments, which can be combined with other embodiments described herein, two or more of the evaporation sources 100 or even each of the evaporation sources can deposit the different layer of different organic material on to the substrate.

According to yet further embodiments, which can be combined with other embodiments described herein, the maintenance vacuum chamber 210 can be provided. For example, the maintenance vacuum chamber 210 can be separated from the vacuum chamber 110 by valve 207. The valve 207 is configured for opening and closing a vacuum seal between the vacuum chamber 110 and the maintenance vacuum chamber 210. An evaporation source 100 can be transferred to the maintenance vacuum chamber 210. Thereafter, the valve can be closed to provide a vacuum seal between the vacuum chamber 110 and the maintenance vacuum chamber 210. Accordingly, the maintenance vacuum chamber can be vented and opened without breaking the vacuum of the vacuum chamber 110.

A further track 820, for example a further looped track is provided in the maintenance vacuum chamber 210. As exemplarily shown in FIG. 8A, the curved portion of the further track 820 can overlap with the curved portion of the looped track 530. This allows for transfer of an evaporation source 100 from the looped track 530 the further track 820. Accordingly, evaporation sources can be moved from the looped track 530 to the further tracks 820 and vice versa. This allows for moving the evaporation sources in the maintenance vacuum chamber 210 for maintenance of the evaporation sources and for moving the maintained evaporation sources from the maintenance vacuum chamber 210 into the vacuum chamber 110. The maintained evaporation sources can evaporate the organic material on the substrate in the vacuum chamber 110.

Even though not shown in FIG. 8A, one or more alignment units for alignment of a substrate and a mask with respect to each other can be provided in a deposition apparatus 500 as shown in FIG. 8A. FIG. 8A shows an embodiment wherein the looped track 530 is provided between the first line defined by the processing position of two substrates and the second line defined by the processing position of two further substrates.

An alternative arrangement of a looped track 530 is shown in FIG. 8B. Thereby, the looped track 530 surrounds at least one substrate, typically two or more substrates arranged along a line defined by the processing positions of the substrates. In light of the above, according to one option (see FIG. 8A) at least two substrates can be oriented such that their respective surfaces, on which organic material is deposited, face each other. According to another option (see FIG. 8B) the substrates in the vacuum chamber 110 and their respective surfaces, on which organic material is deposited, is oriented in the same direction. Even though the deposition apparatuses 500 shown in FIGS. 8A and 8B illustrate vacuum chambers 110, which are configured to house four substrates 121, respective modifications can also be provided for vacuum chambers, which are configured to house two substrates 121. Further details, aspects, and features, for example relating to the maintenance vacuum chamber 210, the further track 820, the transportation track 621, the transfer chambers 810, or the like, can be implemented in the embodiment shown in FIG. 8B in a similar manner as described with respect to the embodiment shown in FIG. 8A.

According to embodiments described herein, deposition apparatus includes a chamber with two or more substrates, i.e. substrate processing regions. As one substrate is being processed, another substrate is moved into the chamber or out of the chamber. Accordingly, one substrate can be processed in one substrate processing region. Further, the substrate located in the second substrate processing region can be removed and a new substrate can be moved into the second substrate processing region.

As described herein, the one or more evaporation sources can be provided as one or more line sources, which scan by a translational movement a stationary substrate. Particularly for embodiments having a source train and/or a looped track, at least one line source can be provided for each organic layer. For example, in the case of a display being manufactured, a line source can be provided for an emissive layer, a hole transport layer, a hole injection layer, or the like.

FIG. 9 illustrates the yet further embodiment of a deposition apparatus 500. The deposition apparatus 500 includes transfer chambers 810, valves 205, the maintenance vacuum chamber 210, and a further track 820 as previously described with respect to other embodiments described herein. Even though the embodiment shown in FIG. 9 includes four transfer chambers 810 in order to assist even better exchange of the substrate 121 into the vacuum chamber for depositing organic material on the substrates, similarly transportation tracks are provided in the transfer chambers 810. The transportation tracks extend into the vacuum rotation compartments 910 for transfer of substrate into the vacuum rotation compartments and out of the vacuum rotation compartments. FIG. 9 shows an example where four vacuum rotation compartments 910 are connected to the vacuum chamber 110. The looped track 530 is provided in the vacuum chamber 110. A plurality of evaporation sources 100 are supported by the looped track 530 and can, thus, conduct a translational movement along the straight portions of the looped track and rotational movements along the curved portions of the looped track.

The vacuum rotation compartments 910 are connected to the vacuum chamber 110 such that the system including the vacuum chamber 110 and the vacuum rotation compartments 910 can be evacuated. Alternatively, one chamber including rotation modules can be provided. The rotation of the substrates within the vacuum rotation compartments 910 is indicated by the circles denoted with reference 911. According to typical embodiments, which can be combined with other embodiments described herein, each of the vacuum rotation compartments includes a vacuum rotation module, wherein the substrate can be loaded or unloaded in a first position of the vacuum rotation module. The rotation of the substrate loaded from a transfer chamber 810 by, for example 180°, moves the substrate 121 in the processing position, wherein the evaporation sources scan along the surface of the substrate. According to yet further alternatives, a substrate rotation for providing the substrates into the processing position can also be provided by an angle different than 180°, for example if the vacuum chambers and compartments are arranged differently. However, 180° rotation for moving a substrate from a transfer position to a processing position provides a comparable small footprint.

As shown in FIG. 9, for example a rotation module can include two alignment units 112 such that the substrate 121 and a mask 132 can be aligned with respect to each other for each of the two substrate locations provided in the rotation module. According to one embodiment, a deposition apparatus can include for example four vacuum rotation modules and eight substrate support positions. However, according to other embodiments, which can be combined with yet further embodiments described herein, a different number of substrate support positions and/or a different number of vacuum rotation modules can be provided. For example, at least two substrate processing positions are provided according to embodiments described herein. The substrate processing positions are thereby arranged to allow for processing of a substrate by a rotation of at least the distribution pipe of an evaporation source. As another example, at least two rotation modules, at least two substrate processing positions and at least four substrate support positions (two of which are also substrate processing positions) can be provided.

Figure 10:
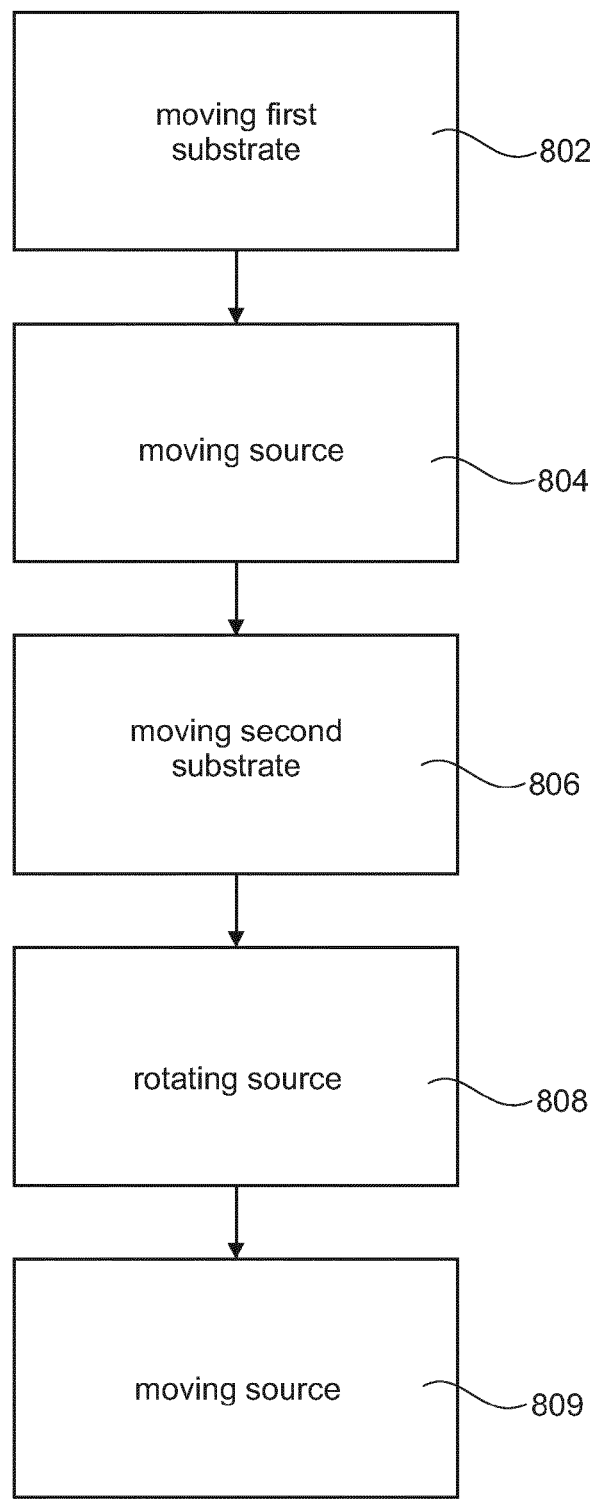
FIG. 10 shows a flow chart illustrating a method for evaporating an organic material according to embodiments described herein.

FIG. 10 shows a flowchart illustrating a method of evaporating an organic material according to embodiments described herein. Generally, too substrate positions are provided to improve the material utilization. This is combined with a translational movement and a rotational movement of evaporation source, particularly of a line source such as a linear distribution showerhead. In step 802 a first substrate, which is provided in an essentially vertical orientation, is moved in the first processing position. An evaporation source moves along the first substrate positioned in the first processing position, for example scans the first substrate, with at least the translational movement, wherein organic material is deposited on the first substrate in step 804. While the first substrate is processed, a second processing position can be prepared for processing of a second substrate therein. For example, a second substrate can be moved in the second processing position, which is different from the first processing position in step 806. Yet further, preparation of the second substrate may include removal of a previously processed substrate from the second processing position and/or alignment of a mask and the second substrate relative to each other. In step 808 at least a distribution pipe of the evaporation source is rotated to be then directed towards the second processing position. As described herein, the rotation can be conducted around an essentially vertical axis, typically the axis along which the line source extends. An evaporation source moves along the second substrate positioned in the second processing position, for example scans the second substrate, with at least a translational movement, wherein organic material is deposited on the second substrate in state 809.

In light of the above various embodiments of evaporation systems, deposition apparatuses, and methods for evaporating an organic material are provided herein, which can be combined with other embodiments herein, particularly which can be used in any of the manufacturing systems described herein. These embodiments are:

Embodiment 1

An evaporation source for organic material, including: an evaporation crucible, wherein the evaporation crucible is configured to evaporate the organic material; a distribution pipe with one or more outlets, wherein the distribution pipe is in fluid communication with the evaporation crucible and wherein the distribution pipe is rotatable around an axis during evaporation; and a support for the distribution pipe, wherein the support is connectable to a first drive or includes the first drive, wherein the first drive is configured for a translational movement of the support and the distribution pipe.

Embodiment 2

The evaporation source according to embodiment 1, wherein the distribution pipe is a vapor distribution showerhead including the one or more outlets, particularly wherein the vapor distribution showerhead is a linear vapor distribution showerhead.

Embodiment 3

The evaporation source according to any of embodiments 1 to 2, wherein the distribution pipe provides a line source extending essentially vertically and/or wherein the axis of rotating the distribution pipe extends essentially vertically.

Embodiment 4

The evaporation source according to any of embodiments 1 to 3, wherein the distribution pipe is rotatable by at least 160°, particularly by 180° or at least 360°.

Embodiment 5

The evaporation source according to any of embodiments 1 to 4, wherein the distribution pipe is rotatable around the axis by a second drive rotating the distribution pipe relative to the support, and particularly also the evaporation crucible relative to the support.

Embodiment 6

The evaporation source according to embodiment 5, wherein the support includes a support housing configured to maintain atmospheric pressure therein, and wherein the support supports the distribution pipe via a rotatable vacuum feed-through, particularly a ferrofluidic feed-through.

Embodiment 7

The evaporation source according to any of embodiments 1 to 4, wherein the distribution pipe is rotatable around the axis by travelling along a looped track.

Embodiment 8

The evaporation source according to any of embodiments 1 to 7, further including: an evaporator control housing configured to maintain atmospheric pressure therein, wherein the housing is supported by the support and is configured to house at least one element selected from the group consisting of: a switch, a valve, a controller, a cooling unit and a cooling control unit.

Embodiment 9

The evaporation source according to any of embodiments 1 to 8, further including: at least one side shield, particularly two side shields, for shielding evaporation of the organic material.

Embodiment 10

The evaporation source according to any of embodiments 1 to 9, further including: a coil for at least one of an inductive power transmission and an inductive signal transmission.

Embodiment 11

The evaporation source according to any of embodiments 1 to 10, further including: at least one second evaporation crucible supported by the support; and at least one second distribution pipe supported by the support, wherein the at least one second distribution pipe is in fluid communication with the at least one second evaporation crucible.

Embodiment 12

A deposition apparatus for depositing organic material in a vacuum chamber, including: a processing vacuum chamber; an evaporation source according to any of embodiments 1 to 11, wherein the evaporation source evaporates the organic material in the processing vacuum chamber; and a substrate support system disposed in the vacuum chamber and having at least two tracks, wherein the at least two tracks of the substrate support system are configured for essentially vertical support of the substrate or a carrier carrying the substrate in the vacuum chamber.

Embodiment 13

The deposition apparatus according to embodiment 12, further including: a maintenance vacuum chamber connected with the processing vacuum chamber; and a vacuum valve for opening and closing a vacuum seal between the processing vacuum chamber and the maintenance vacuum chamber, wherein the evaporation source can be transferred from the processing vacuum chamber to the maintenance vacuum chamber and from the maintenance vacuum chamber to the processing vacuum chamber.

Embodiment 14

A method for evaporating an organic material, including: moving a first substrate in an essentially vertical first processing position; moving an evaporation source along the first substrate with at least a translational movement whilst the evaporation source evaporates the organic material; moving a second substrate in an essentially vertical second processing position different from the first processing position; rotating a distribution pipe of the evaporation source around an axis during evaporation; and moving the evaporation source along the second substrate with at least a further translational movement whilst the evaporation source evaporates the organic material.

Embodiment 15

The method according to embodiment 14, wherein the second substrate is moved in the essentially vertical second processing position while the evaporation source is moved along the first substrate.

Figure 11:
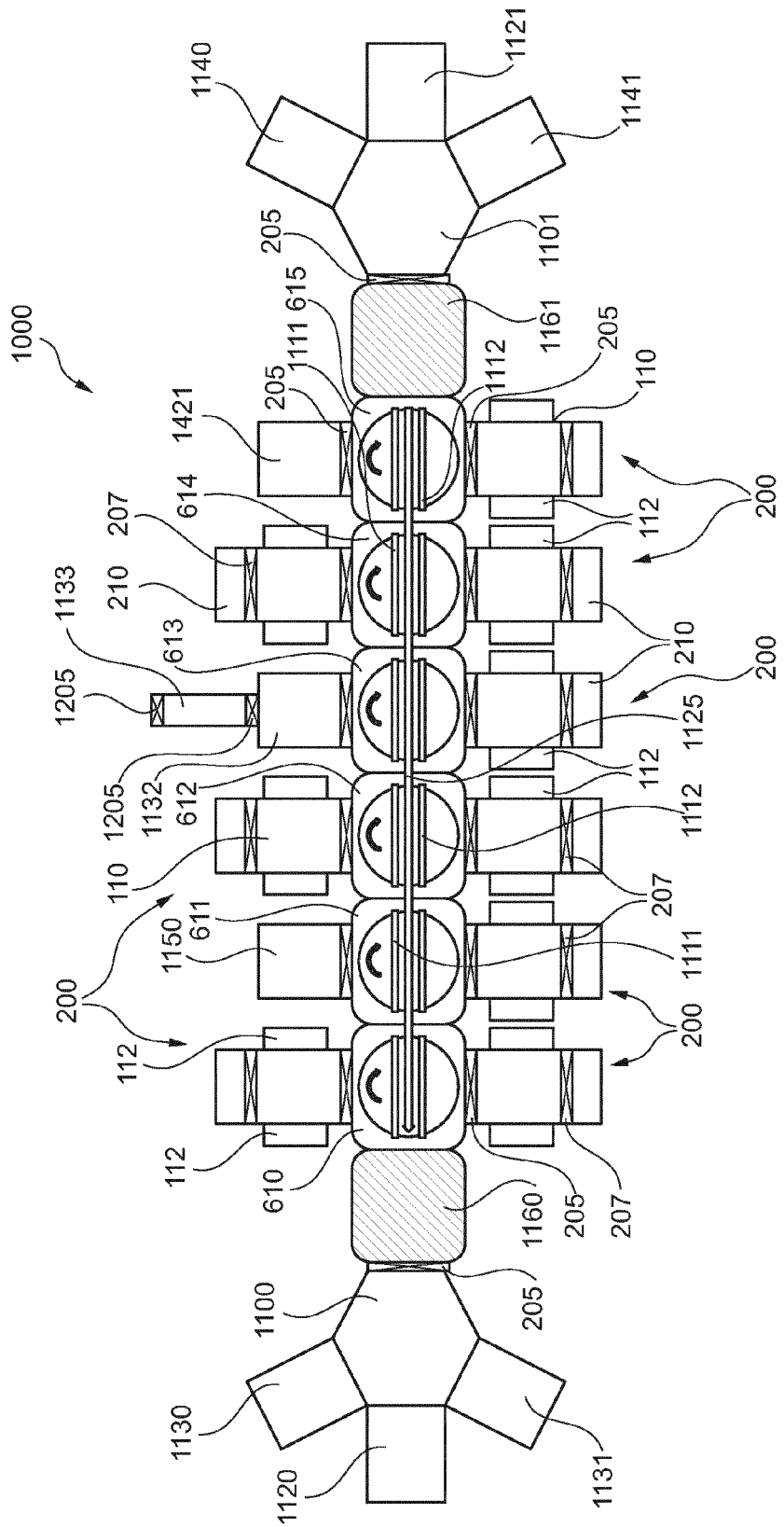
FIG. 11 shows a manufacturing system having a cluster system portion, a vacuum swing module, a transfer chamber, a further transfer chamber, a further vacuum swing module and a further cluster system portion according to embodiments described herein.

FIG. 11 shows a system 1000 for manufacturing devices, particularly devices including organic materials therein. For example, the devices can be electronic devices or semiconductor devices, such as optoelectronic devices and particularly displays. An improved carrier handling and/or mask handling of a mass production system can be provided. According to typical embodiments, which can be combined with other embodiments described herein, these improvements can be beneficially utilized for OLED device manufacturing and can, thus, include deposition apparatuses, components thereof, and methods of operating the deposition apparatuses as described with respect to FIGS. 1A to 10. However, the improvements in carrier handling and/or mask handling, which is provided by the concepts of arrangement of various chambers as described herein, may also be utilized for other substrate processing systems, for example substrates processing systems including evaporation sources, sputter sources, particularly a rotary sputter targets, CVD deposition sources, such as PECVD deposition sources, or combinations thereof. The present disclosure relating to manufacturing systems, particularly on large area substrates, for example large area glass substrates, is described with respect to OLED manufacturing systems, as these OLED manufacturing systems may particularly benefit from the concepts described below.

Embodiments described herein particularly relate to deposition of materials, e.g. for display manufacturing and on large area substrates. According to some embodiments, large area substrates or carriers supporting one or more substrates, i.e. large area carriers, may have a size of at least $0.174 \, m^2$. Typically, the size of the carrier can be about $1.4 \, m^2$ to about $8 \, m^2$, more typically about $2 \, m^2$ to about $9 \, m^2$ or even up to $12 \, m^2$. Typically, the rectangular area, in which the substrates are supported and for which the holding arrangements, apparatuses, and methods according to embodiments described herein are provided, are carriers having sizes for large area substrates as described herein. For instance, a large area carrier, which would correspond to an area of a single large area substrate, can be GEN 5, which corresponds to about $1.4 \, m^2$ substrates ($1.1 \, m \times 1.3 \, m$), GEN 7.5, which corresponds to about $4.29 \, m^2$ substrates ($1.95 \, m \times 2.2 \, m$), GEN 8.5, which corresponds to about $5.7 \, m^2$ substrates ($2.2 \, m \times 2.5 \, m$), or even GEN 10, which corresponds to about $8.7 \, m^2$ substrates ($2.85 \, m \times 3.05 \, m$). Even larger generations such as GEN 11 and GEN 12 and corresponding substrate areas can similarly be implemented. According to typical embodiments, which can be combined with other embodiments described herein, the substrate thickness can be from 0.1 to 1.8 mm and the holding arrangement, and particularly the holding devices, can be adapted for such substrate thicknesses. However, particularly the substrate thickness can be about 0.9 mm or below, such as 0.5 mm or 0.3 mm, and the holding arrangement, and particularly the holding devices, are adapted for such substrate thicknesses. Typically, the substrate may be made from any material suitable for material deposition. For instance, the substrate may be made from a material selected from the group consisting of glass (for instance soda-lime glass, borosilicate glass etc.), metal, polymer, ceramic, compound materials, carbon fiber materials or any other material or combination of materials which can be coated by a deposition process.

The coater or deposition system concepts, e.g. for OLED mass production according to some embodiments, provides a vertical cluster approach, such that for example "random" access to all chamber may be provided. Accordingly, such concepts are efficient for both RGB and White on CF (color filter) deposition by offering flexibility in adding a desired number of modules required. This flexibility could also be used to create redundancy. Generally, for OLED display manufacturing two concepts can be provided. On the one hand, RGB (red green blue) displays having emission of red light, green light, and blue light are manufactured. On the other hand, White on CF displays are manufactured, wherein white light is emitted and colors are generated by a color filter. Even though White on CF displays require a reduced number of chambers for manufacturing such a device, both concepts are in practice and have their pros and cons.

According to embodiments described herein, which can be combined with other embodiments described herein, OLED device manufacturing typically includes masking of the substrates for deposition. Further, the large area substrates are typically supported by a carrier during processing thereof. Both mask handling and carrier handling can be critical particularly for OLED devices with respect to temperature stability, cleanliness of mask and carrier and the like. Accordingly, embodiments described herein provide a carrier return path under vacuum conditions or under a defined gas atmosphere, e.g. a protective gas, and improved cleaning options for carriers and masks. In addition, the improved system uptime, the improved deposition source efficiency, and/or the improved material utilization, which are described with respect to the deposition apparatus arrangements described with respect to FIGS. 1A to 10, may be provided. These arrangements avoid the need to vent the substrate handling chamber or deposition chamber during routine maintenance or during mask exchange.

According to yet further embodiments, which can be combined with other embodiments described herein, mask cleaning can be provided either in-situ, for example by an optional plasma cleaning or can be provided by offering a mask exchange interface to allow for external mask cleaning without venting processing chambers or transfer chambers of the manufacturing system.

The manufacturing system 1000 shown in FIG. 11 includes a load lock chamber 1120, which is connected to a horizontal substrate handling chamber 1100. The substrate can be transferred from the glass handling chamber 1102 to a vacuum swing module 1160, wherein the substrate is loaded in a horizontal position on a carrier. After loading the substrate on the carrier in the horizontal position, the vacuum swing module 1160 rotates the carrier having the substrate provided thereon in a vertical or essentially vertical orientation. The carrier having the substrate provided thereon is then transferred through a first transfer chamber 610 and at least one further transfer chamber (611-615) having the vertical orientation. One or more deposition apparatuses 200 can be connected to the transfer chambers. Further, other substrate processing chambers or other vacuum chambers can be connected to one or more of the transfer chambers. After processing of the substrate, the carrier having a substrate thereon is transferred from the transfer chamber 615 into a further vacuum swing module 1161 in the vertical orientation. The further vacuum swing module 1161 rotates the carrier having a substrate thereon from the vertical orientation to a horizontal orientation. Thereafter, the substrate can be unloaded into a further horizontal glass handling chamber 1101. The processed substrate may be unloaded from the processing system 1000 through load lock chamber 1121, for example after the manufactured device is encapsulated in one of the thin-film encapsulation chambers 1140 or 1141.

In FIG. 11, a first transfer chamber 610, a second transfer chamber 611, a third transfer chamber 612, a fourth transfer chamber 613, a fifth transfer chamber 614, and a sixth transfer chamber 615 are provided. According to embodiments described herein, at least two transfer chambers are included in a manufacturing system, typically 2 to 8 transfer chambers can be included in the manufacturing system. Several deposition apparatuses, for example 9 deposition apparatuses 200 in FIG. 11, each having a vacuum chamber 110 and each being exemplarily connected to one of the transfer chambers are provided. According to some embodiments, one or more of the vacuum chambers of the deposition apparatuses are connected to the transfer chambers via gate valves 205.

Alignment units 112 can be provided at the vacuum chambers 110 and in accordance with any of the embodiments described with respect to FIGS. 1A to 10. According to yet further embodiments, which can be combined with other embodiments described herein, vacuum maintenance chambers 210 can be connected to the vacuum chambers 110, for example via gate valve 207. The vacuum maintenance chambers 210 allow for maintenance of deposition sources in the manufacturing system 1000. Further details of the maintenance vacuum chambers 210 have been described with respect to FIGS. 1A to 10 and can similarly be provided for embodiments relating to manufacturing systems.

According to some embodiments, and as shown in FIG. 11, the one or more transfer chambers 610-615 are provided along a line for providing an in-line transportation system portion. According to some embodiments described herein, which can be combined with other embodiments described herein, a dual track transportation arrangement is provided wherein the transfer chambers include a first track 1111 and a second track 1112 in order to transfer carriers, i.e. carriers supporting substrates, along at least one of the first track and the second track. The first tracks 1111 and the second tracks 1112 in the transfer chambers provide a dual track transportation arrangement in the manufacturing system 1000.

According to yet further embodiments, which can be combined with other embodiments described herein, one or more of the transfer chambers 610-615 are provided as a vacuum rotation module. The first track 1111 and the second track 1112 can be rotated by at least 90°, for example by 90°, 180° or 360°. The carriers on the tracks are rotated in the position to be transferred in one of the vacuum chambers of the deposition apparatuses 200 or one of the other vacuum chambers described below. The transfer chambers are configured to rotate the vertically oriented carriers and/or substrates, wherein for example that tracks in the transfer chambers are rotated around a vertical rotation axis. This is indicated by the arrows in FIG. 11.

According to some embodiments, which can be combined with other embodiments described herein, the transfer chambers are vacuum rotation modules for rotation substrate under a pressure below 10 mbar. According to yet further embodiments, which can be combined with other embodiments described herein, a further track is provided within the two or more transfer chambers (610-615), wherein a carrier return track is provided. According to typical embodiments, the carrier return track 1125 can be provided between the first track 1111 and second track 1112. The carrier return track 1125 allows for returning empty carriers from the further the vacuum swing module 1161 to the vacuum swing module 1160 under vacuum conditions. Returning the carriers under vacuum conditions and, optionally under controlled inert atmosphere (e.g. Ar, $N_2$ or combinations thereof) reduces the carriers' exposure to ambient air. Contact to moisture can be reduced or avoided. Thus, the outgassing of the carriers during manufacturing of the devices in the manufacturing system 1000 can be reduced. This may improve the quality of the manufactured devices and/or the carriers can be in operation without being cleaned for an extended time.

FIG. 11 further shows a first pretreatment chamber 1130 and a second pretreatment chamber 1131. A robot (not shown) or another handling system can be provided in the substrate handling chamber 1100. The robot or the another handling system can load the substrate from the load lock chamber 1120 in the substrate handling chamber 1100 and transfer the substrate into one or more of the pretreatment chambers (1130, 1131). For example, the pretreatment chambers can include a pretreatment tool selected from the group consisting of: plasma pretreatment of the substrate, cleaning of the substrate, UV and/or ozone treatment of the substrate, ion source treatment of the substrate, RF or microwave plasma treatment of the substrate, and combinations thereof. After pretreatment of the substrates, the robot or another handling system transfers the substrate out of pretreatment chamber via the substrate handling chamber into the vacuum swing module 1160. In order to allow for venting the load lock chamber 1120 for loading of the substrates and/or for handling of the substrate in the substrate handling chamber 1100 under atmospheric conditions, a gate valve 205 is provided between the substrate handling chamber 1100 and the vacuum swing module 1160. Accordingly, the substrate handling chamber 1100, and if desired one or more of the load lock chamber 1120, the first pretreatment chamber 1130 and the second pretreatment chamber 1131, can be evacuated before the gate valve 205 is opened and the substrate is transferred into the vacuum swing module 1160. Accordingly, loading, treatment and processing of substrates may be conducted under atmospheric conditions before the substrate is loaded into the vacuum swing module 1160.

According to embodiments described herein, which can be combined with other embodiments described herein, loading, treatment and processing of substrates, which may be conducted before the substrate is loaded into the vacuum swing module 1160 is conducted while the substrate is horizontally oriented or essentially horizontally oriented. The manufacturing system 1000 as shown in FIG. 11, and according to yet further embodiments described herein, combines a substrate handling in a horizontal orientation, a rotation of the substrate in a vertical orientation, material deposition onto the substrate in the vertical orientation, a rotation of the substrate in a horizontal orientation after the material deposition, and an unloading of the substrate in a horizontal orientation.

The manufacturing system 1000 shown in FIG. 11, as well as other manufacturing systems described herein, include at least one thin-film encapsulation chamber. FIG. 11 shows a first thin-film encapsulation chamber 1140 and a second thin-film encapsulation chamber 1141. The one or more thin-film encapsulation chambers include an encapsulation apparatus, wherein the deposited and/or processed layers, particularly an OLED material, are encapsulated between, i.e. sandwiched between, the processed substrate and a further substrate in order to protect the deposited and/or processed material from being exposed to ambient air and/or atmospheric conditions. Typically, the thin-film encapsulation can be provided by sandwiching the material between two substrates, for example glass substrates. However, other encapsulation methods like lamination with glass, polymer or metal sheets, or laser fusing of a cover glass may alternatively be applied by an encapsulation apparatus provided in one of the thin-film encapsulation chambers. In particular, OLED material layers may suffer from exposure to ambient air and/or oxygen and moisture. Accordingly, the manufacturing system 1000, for example as shown in FIG. 11, can encapsulate the thin films before unloading the processed substrate via load lock chamber 1121.

The manufacturing system 1000 shown in FIG. 11, as well as other manufacturing systems described herein, can further include a layer inspection chamber 1150. A layer inspection tool, such as an electron and/or ion layer inspection tool, can be provided in the layer inspection chamber 1150. Layer inspection can be conducted after one or more depositions steps or processing steps provided in the manufacturing system 1000. Therefore, a carrier having a substrate therein can be moved from a deposition or processing chamber to the transfer chamber 611 to which the layer inspection chamber 1150 is connected via gate valve 205. The substrate to be inspected can be transferred in the layer inspection chamber and inspected within the manufacturing system, i.e. without removing the substrate from the manufacturing system. An online layer inspection can be provided after one or more of the deposition steps or processing steps, which may be conducted in the manufacturing system 1000.

According to yet further embodiments, which can be combined with other embodiments described herein, the manufacturing system can include a carrier buffer 1421. For example, the carrier buffer can be connected to the first transfer chamber 610, which is connected to the vacuum swing module 1160 and/or the last transfer chamber, i.e. the sixth transfer chamber 615. For example, the carrier buffer can be connected to one of the transfer chambers, which is connected to one of the vacuum swing modules. Since the substrates are loaded and unloaded in the vacuum swing modules, it is beneficial if the carrier buffer 1421 is provided close to a vacuum swing module. The carrier buffer is configured to provide the storage for one or more, for example 5 to 30, carriers. The carriers in the buffer can be used during operation of the manufacturing system in the event another carrier needs to be replaced, for example for maintenance, such as cleaning.

According to yet further embodiments, which can be combined with other embodiments described herein, the manufacturing system can further include a mask shelf 1132, i.e. a mask buffer. The mask shelf 1132 is configured to provide storage for replacement masks and or masks, which need to be stored for specific deposition steps. According to methods of operating a manufacturing system 1000, a mask can be transferred from the mask shelf 1132 to a deposition apparatus 200 via the dual track transportation arrangement having the first track 1111 and the second track 1112. Thus, a mask in a deposition apparatus can be exchanged either for maintenance, such as cleaning, or for a variation of a deposition pattern without venting a deposition apparatus, without venting a transfer chamber, and/or without exposing the mask to atmospheric pressure.

FIG. 11 further shows a mask cleaning chamber 1133. The mask cleaning chamber 1133 is connected to the mask shelf 1132 via gate valve 1205. Accordingly, a vacuum tight sealing can be provided between the mask shelf 1132 and the mask cleaning chamber 1133 for cleaning of a mask. According to different embodiments, the mask can be cleaned within the manufacturing system 1000 by a cleaning tool, such as a plasma cleaning tool. A plasma cleaning tool can be provided in the mask cleaning chamber 1133. Additionally or alternatively, a further gate valve 1206 can be provided at the mask cleaning chamber 1133, as shown in FIG. 11. Accordingly, a mask can be unloaded from the manufacturing system 1000 while only the mask cleaning chamber 1133 needs to be vented. By unloading the mask from the manufacturing system, an external mask cleaning can be provided while the manufacturing system continues to be fully operating. FIG. 11 illustrates the mask cleaning chamber 1133 adjacent to the mask shelf 1132. A corresponding or similar cleaning chamber (not shown) may also be provided adjacent to the carrier buffer 1421. By providing a cleaning chamber adjacent to the carrier buffer 1421, the carrier may be cleaned within the manufacturing system 1000 or can be unloaded from the manufacturing system through the gate valve connected to the cleaning chamber.

A device such as an OLED display can be manufactured in the manufacturing system 1000 as shown in FIG. 11 as follows. This is an exemplary manufacturing method only and many other devices may be manufactured by other manufacturing methods. The substrate can be loaded into the substrate handling chamber 1100 via load lock chamber 1120. A substrate pretreatment can be provided within the pretreatment chamber 1130 and/or 1131 before the substrate is loaded in the vacuum swing module 1160. The substrate is loaded on a carrier in the vacuum swing module 1160 and rotated from a horizontal orientation to a vertical orientation. Thereafter, the substrate is transferred through the transfer chambers 610 to 615. The vacuum rotation module provided in the transfer chamber 615 is rotated such that the carrier with the substrate can be moved to the deposition apparatus provided at the lower side of transfer chamber 615 in FIG. 11. Further rotation steps of one of the vacuum rotation modules in one of the transfer chambers and transfer steps through one or more of the transfer chambers are in the following omitted for ease of reference in the description of display manufacturing according to this paragraph. In the deposition apparatus an electrode deposition is conducted in order to deposit the anode of the device on the substrate. The carrier is removed from the electrode deposition chamber and moved to one of the deposition apparatuses 200, which are connected to the transfer chamber 610, both of which are configured to deposit a first hole injection layer. The two deposition apparatuses connected to the transfer chamber 610 can, for example, be alternatively utilized for the deposition of a hole injection layer on different substrates. The carrier is then transferred to the lower chamber connected to the transfer chamber 612 (in FIG. 11), such that the first hole transportation layer can be deposited by the deposition apparatus 200 provided below the transfer chamber 612 in FIG. 11. Thereafter, the carrier is transported to the deposition apparatus 200 provided at the lower side of transfer chamber 613 in FIG. 11, such that a blue emission layer can be deposited on the first hole transportation layer. The carrier is then transported to the deposition apparatus connected at the lower end of transfer chambers 614 in order to deposit the first electron transportation layer. In a subsequent step, further hole injection layers can be deposited, for example in the deposition apparatus provided at the lower side of transfer chamber 611 in FIG. 11, before the red emission layer can be provided in the deposition apparatus at the upper side of transfer chambers 612, and the green emission layer can be deposited in the deposition apparatus provided at the upper side of transfer chamber 614 in FIG. 11. Further, electron transportation layers may be provided between the emission layers and or above the emission layers. At the end of the manufacturing, a cathode can be deposited in the deposition apparatus provide below the transfer chamber 615 in FIG. 11. According to yet further embodiments, additionally one or more exciton blocking layers (or hole blocking layers) or one or more electron injection layers may be deposited between the anode and the cathode. After deposition of the cathode, the carrier is transferred to the further vacuum swing module 1161, wherein the carrier with the substrate is rotated from the vertical orientation to a horizontal orientation. Thereafter, the substrate is unloaded from the carrier in the further substrate handling chamber 1101 and transferred to one of the thin-film encapsulation chambers 1140/1141 for encapsulating the deposited layer stack. Thereafter, the manufacturer device can be unloaded through load lock chamber 1121.

Figure 12A:
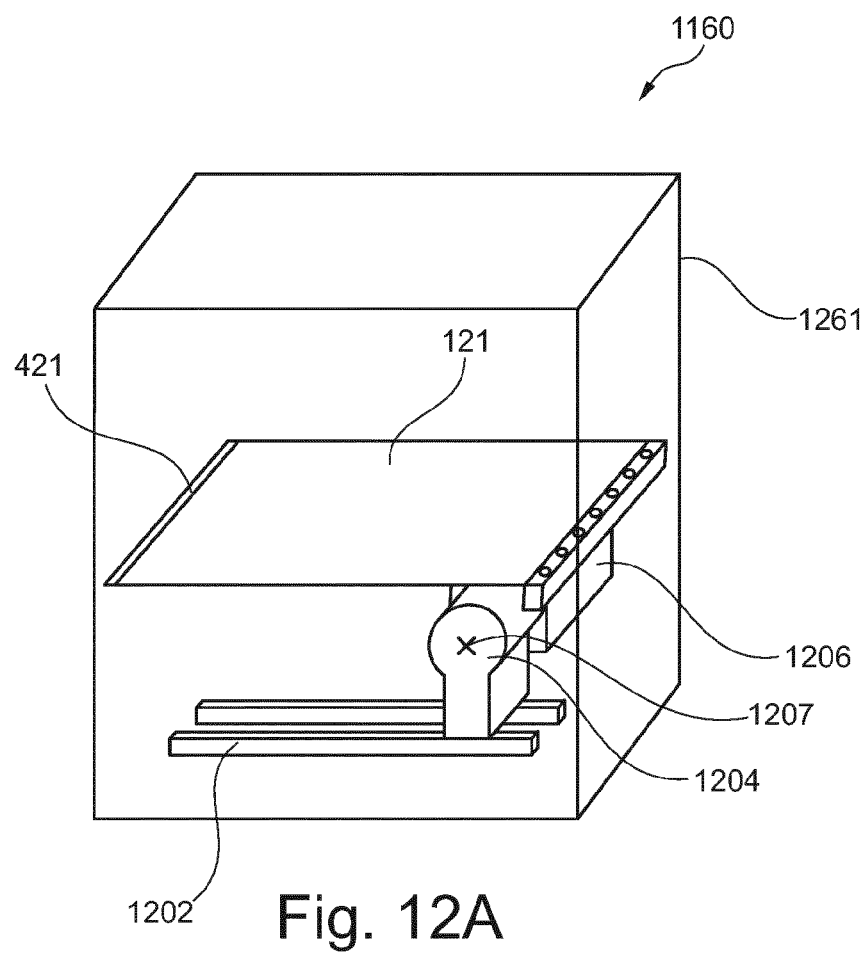
FIG. 12A shows a vacuum swing module, which can be used in manufacturing systems according to embodiments described herein.

FIG. 12A shows a vacuum swing module 1160. Other vacuum swing modules like the further vacuum swing module 1161 shown in FIG. 11, can include similar features, details, and aspects. The vacuum swing module 1160 includes a vacuum chamber 1261. The vacuum chamber typically has one or more flanges for connecting an evacuation unit, for example a vacuum pump, to the vacuum chamber. Accordingly, the vacuum chamber 1261 can be evacuated to a technical vacuum, which is typically provided in one or more chambers of a manufacturing system described herein, e.g. of 10 mbar or below. The vacuum swing module is provided within the vacuum chamber 1261. The swing module includes a base 1202. The base 1202 is configured to provide stability while the substrate 121, which is loaded on a carrier 421 is supported in the vertical orientation or horizontal orientation. The latter orientation is shown in FIG. 12A. An actuator 1204, for example a torque motor, can rotate the support 1206 around the axis 1205. Accordingly, the support and/or a table connected thereto can be rotated from the horizontal orientation to a vertical orientation and vice versa. In light of the above, the substrate 121 can be loaded on a carrier 421 while the support is provided having a horizontal orientation. Thereafter, the carrier 421 supporting the substrate 121 can be rotated from the horizontal orientation to vertical orientation and moved along the transportation path, while being vertically oriented, out of the vacuum chamber 1261. In a reverse process, the carrier can be moved along the transportation path while being vertically oriented into the vacuum chamber 1261. The carrier 421 supporting the substrate 121 can be rotated from the vertical orientation to a horizontal orientation by the swing module within the vacuum chamber 1261. Thereafter, the substrate 121 can be unloaded from the carrier 421.

Figure 12B:
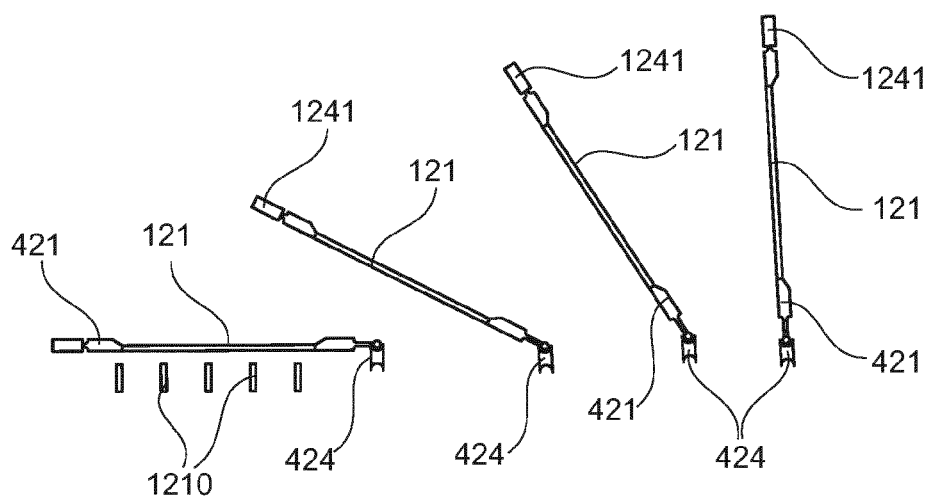
FIG. 12B shows the rotation of carrier having a substrate supported therein in the vacuum swing module as described with respect to FIG. 12A.

FIG. 12B illustrates a sequence of rotating the substrate 121 provided in a carrier 421 from a horizontal orientation in a vertical orientation or vice versa. From left to right, the substrate 121 is provided in the carrier 421. Lift pins 1210 can be provided below the carrier 421 such that the substrate 121 is raised or lowered relative to the carrier 421 upon the vertical movement of the lift pins 1210. The carrier typically includes a substrate receiving portion, an upper guiding portion 1241, and a lower guiding portion. The upper guiding portion can include one or more permanent magnets to allow for magnetic guiding of the carrier in the transportation arrangement. The lower guiding portion can include a rod, which is configured to be guided on one or more rollers 424. A plurality of rollers 424 can form a lower portion of the transportation arrangement.

Before the substrate 121 is loaded on the carrier 421, the lift pins 1210 are moved vertically to a raised position. A robot or another actuator can load a substrate in the vacuum swing module and place the substrate onto the lift pins 1210. Accordingly, the lift pins 1210 support the substrate 121. Thereafter, the lift pins 1000 2010 can be lowered, whereby the substrate 121 is loaded onto the carrier 421. Thereafter, the carrier 421 can be rotated as shown by the sequence of FIG. 12B, while the rod of the carrier 421 is located in one or more rollers 424 of the transportation system. After the carrier (and, thus, the substrate) has been raised to a vertical position, the carrier can be moved along the transportation path of the manufacturing system.

Figure 13A:
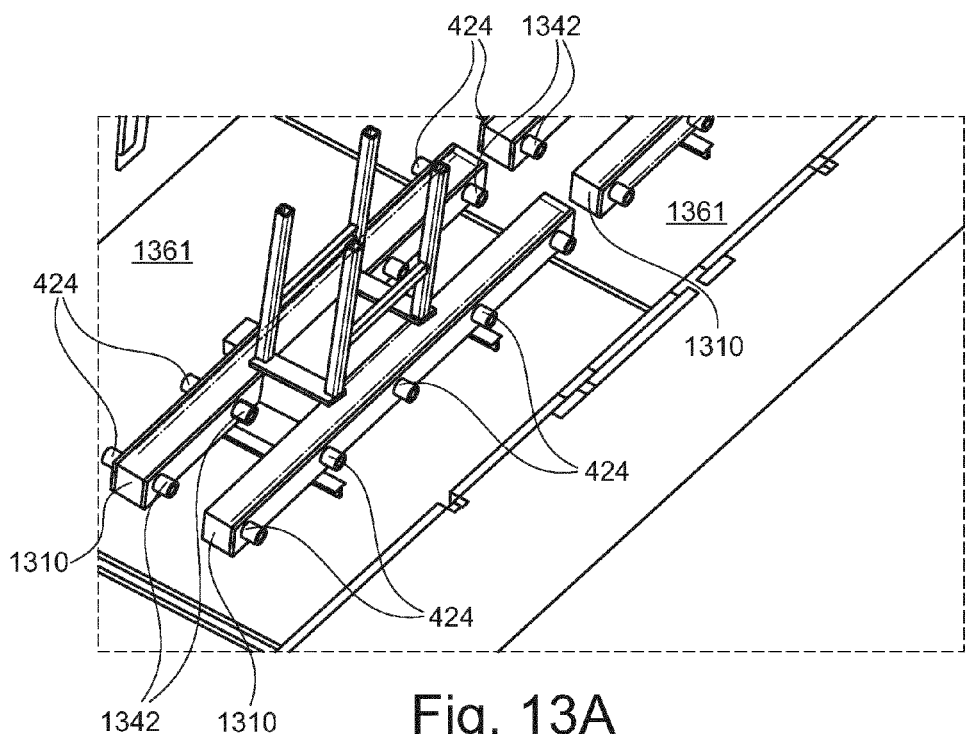
FIGS. 13A to 13C illustrate a dual track transportation arrangement, which can be provided in transfer chambers according to some embodiments described herein, wherein a carrier return track is further provided.
Figures 13B, 13C:
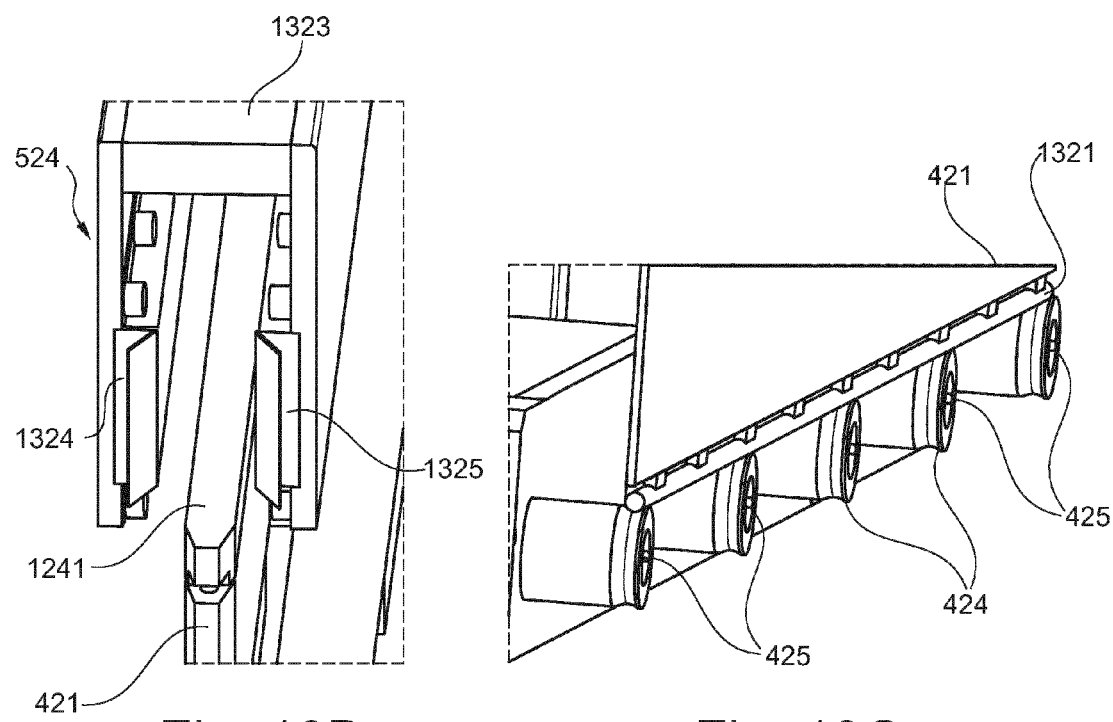

FIG. 13A shows portions of two adjacent transfer chambers 1361. Two supports 1310 are provided in each of the chambers. The supports 1310 can be parallel to each other and arranged to be together rotatably about a common vertical rotation axis. A plurality of rollers 424 are provided at respective sides of the supports 1310 facing the wall of the transfer chambers 1361. In this manner, a transportation track is provided along each of the supports 1310 and a dual track transportation system is provided. An additional set of rollers 1342 is provided on the side of one of the supports 1310 facing the respective others support. The additional set of rollers 1342 provides a carrier return track within the transfer chamber 1361. FIG. 13A shows lower portions of the dual track transportation arrangement, which is shown in more detail in FIG. 13C. FIG. 13B shows an upper portion of one track of the transportation arrangement. A magnetic guiding element 524 is provided at the upper portion of the transportation track. A first magnet 1324 and a second magnet 1325 is provided at respective side portions of the magnet support element 1323. The magnet support element 1323 can be a U-shaped support element such that the first magnet 1324 and the second magnet 1325 can be provided on opposing sides of the carrier 421 or an upper guiding portion 1241 of the carrier, respectively. The upper guiding portion 1241 of the carrier 421 includes a permanent magnet, such that the carrier is guided without contact between the first magnet 1324 and the second magnet 1325.

FIG. 13C shows a lower portion of one track of the transportation arrangement. A plurality of rollers 424 are rotatably mounted on respective axes 425. The rollers 424 have a curved outer surface, particularly a concave outer surface, such that a rod 1321 of the carrier 421 can be guided along the plurality of rollers. According to different embodiments, one or more of the rollers 424 can be driven by a motor or the like. For example, a motor can be connected to a belt system or drive chain, which is in turn connected to two or more of the rollers for rotating the rollers at the common rotational speed.

According to yet further embodiments, which can be combined with other embodiments described herein, a carrier may also be magnetically levitated. According to such embodiments, the magnetic levitation of the carrier can be provided at the lower portion of each of the tracks of the dual track transportation system. Additionally, the magnetic guiding of the carrier can be provided at the upper portion of each of the tracks of the dual track transportation system.

According to some embodiments, which can be combined with other embodiments described herein, the carrier adapted to use in a processing system includes an electrode assembly and a support base. The electrode assembly is configured to generate an electrostatic chucking force for securing a substrate to the substrate carrier. According to yet further additional or alternative modifications, the support base has a heating/cooling reservoir formed therein. The electrode assembly and the support base form a unitary body configured for transport within a processing system. The carrier can be connectable to supply media in the processing system. A quick disconnect can be coupled to the body and configured to trap a heat regulating medium in the reservoir heating/cooling reservoir when the body is decoupled from a source of heat regulating medium. A quick disconnect can be coupled to the body and configured to trap a heat regulating medium in the reservoir heating/cooling reservoir when the body is decoupled from a source of heat regulating medium. A quick disconnect can be coupled to apply chucking charge.

According to yet further embodiments, inductive power coupling elements can be provided in one or more of the transfer chambers 1361 for powering the electrostatic carrier at the lower portion of one or more tracks of the dual track transportation arrangement and/or at an upper portion of one or more tracks of the dual tracks transportation arrangement. For example, one or more coils, i.e. a conductive loop or conductive loops, can be provided at the lower and/or upper end of the carrier. For example, these loops can be smaller loops as compared to a further coil arrangement provided for the track of the dual track transportation arrangement. The track of the dual track transportation arrangement may have further coil arrangement, for example a large loop. In light of the one or more coils at the carrier and the further coil arrangement at the track, and inductive power transmission can be provided. According to a specific example, the large loop at the track can extend along the length of the support 1310 shown in FIG. 13A. It may be possible that the large loop extends at least along 50% of the entire length of the support 1310, particularly at least 90% of the entire length. According to different or alternative implementations, the electrical contacts, i.e. sliding contact, may be provided while the carrier is transported along the track of the transfer chamber 1361.

Figure 14:
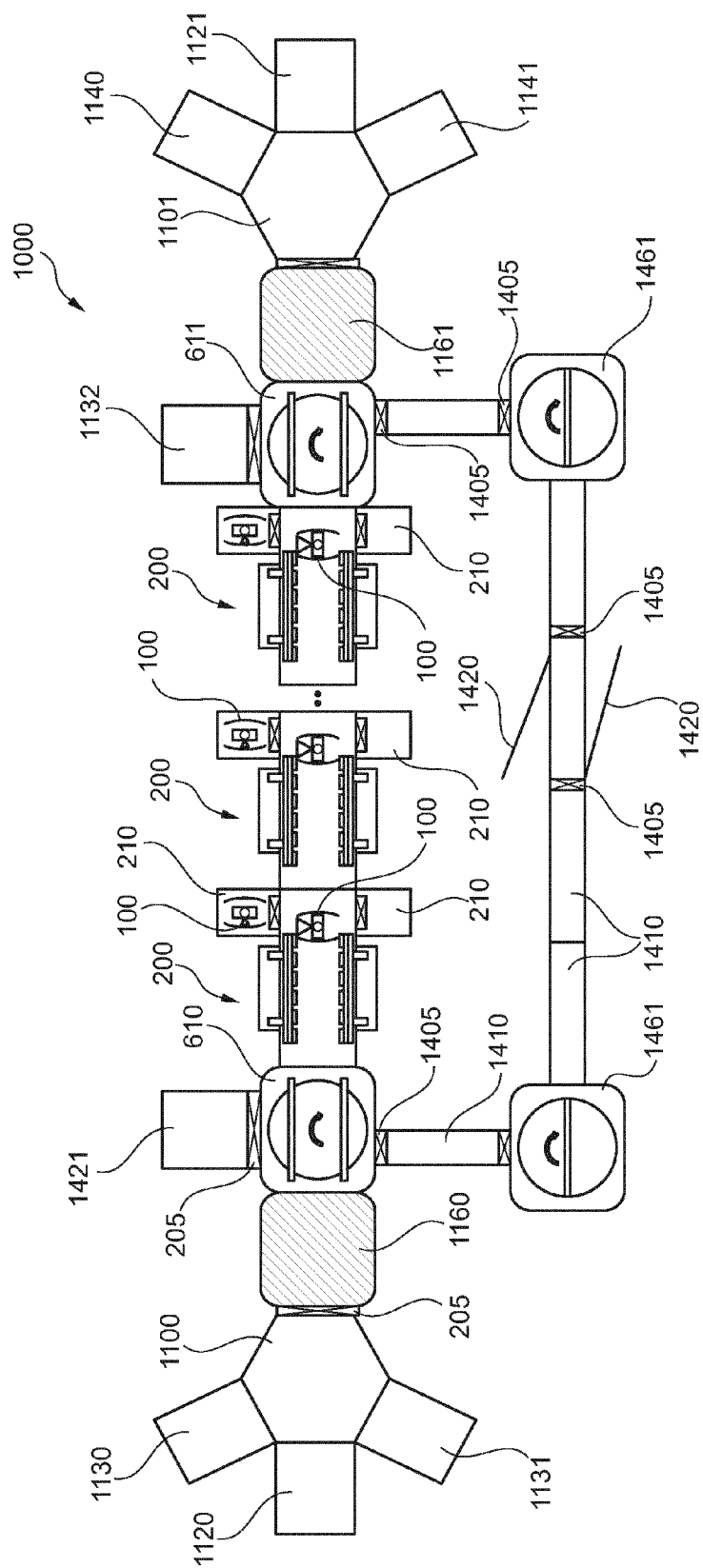
FIG. 14 shows a further manufacturing system having a cluster system portion, a vacuum swing module, a transfer chamber, a further transfer chamber, a further vacuum swing module, and a further cluster system portion, wherein an in-line deposition system portion and a carrier return track are provided according to some embodiments described herein.

FIG. 14 shows a yet further manufacturing system 1000 according to embodiments described herein. Chambers, components, features, aspects, and elements, which are similar to the manufacturing system of embodiments described with respect to FIG. 11, are not described again when referring to FIG. 14. That is, only the differences with respect to different embodiments are described. FIG. 14 shows a manufacturing system 1000 with a first transfer chamber 610 and a second transfer chamber 611. One or more deposition apparatuses 200 are provided between the first transfer chamber 610 and the second transfer chamber 611. FIG. 14 shows three deposition apparatuses as an example, wherein the dots between the second and third deposition apparatus indicate the option of having even more deposition apparatuses, i.e. deposition chambers, provided between the first transfer chamber 610 and the second transfer chamber 611. According to some embodiments, which can be combined with other embodiments described herein, for example three, four, five, six, or seven deposition chambers i.e. deposition apparatuses, can be provided between the transfer chambers. A portion of the manufacturing system 1000 is provided as an in-line deposition system portion. In light of this concept of the manufacturing system 1000 shown in FIG. 14, i.e. having an in-line deposition system portion, a number of deposition chambers or deposition apparatuses 200 may be reduced as compared to FIG. 11. The reduced number of deposition chambers can for example be used for White on CF displays.

A carrier buffer 1421 is connected via gate valve 205 to the first transfer chamber 610 and a mask shelf 1132 is connected via a gate valve 205 to the second transfer chamber 611. The deposition apparatuses 200 can be provided according to various embodiments described herein, particularly with respect to FIGS. 1A to 10, wherein one or more maintenance vacuum chambers for maintenance of evaporation sources 100 are provided at the side of the vacuum chambers of the deposition apparatuses such that an in-line transportation of carriers from one deposition apparatus to an adjacent deposition apparatus can be provided.

As can be seen exemplarily in FIGS. 11 and 14, embodiments can be directed to a system, which includes a cluster deposition system portion (FIG. 11) and/or in-line deposition system portion and one or more cluster portions, e.g. for loading and pre-treatment and for unloading and post-treatment of substrates. The system can be a hybrid system between an in-line processing system and a cluster processing system.

As shown in FIG. 14, the deposition apparatuses 200 can each deposit material onto substrates. The two substrates can be transported along a dual track transportation system from the transfer chamber 610 to the further transfer chamber 611.

Embodiments described with respect to FIG. 14 provide a carrier return path by several carrier return chambers 1410. The carrier return chamber 1410 can be connected to each of the transfer chambers 610 and 611, respectively, via the gate valve 1405. One or more of the carrier return chambers connected to a transfer chamber may also be provided as a load lock chamber, i.e. a chamber to be vented and evacuated. Providing a carrier return chamber as a load lock chamber allows compensating a pressure difference between a transfer chamber (e.g. transfer chamber 610 or 611 of the manufacturing system 1000) and an adjacent chamber, e.g. a vacuum rotation module or another carrier return chamber, which may then be operated at higher pressures, e.g. with an inert gas atmosphere. As shown in FIG. 14, two vacuum rotation modules 1461 are provided. For example, they may also be connected to the carrier return chambers 1410 via the gate valve 1405. A plurality of carrier return chambers 1410 extend along the extension of the in-line deposition portion of the manufacturing system 1000. According to some embodiments, which can be combined with other embodiments described herein, a carrier return path having the carrier return chambers can be configured to return to carriers under vacuum conditions or under a controlled inert atmosphere or controlled gas condition having a defined gas mixture, such as argon, nitrogen, a combination thereof. In light of this carrier return track, exposure of the carriers to ambient air can be avoided. This can reduce the degassing of carriers in the manufacturing system 1000. For example, an inert atmosphere contains inert gases. An inert atmosphere contains reactive gases, such as oxygen or moisture, with a concentration of 10 ppm or below, e.g. 1 ppm or below.

According to some embodiments, which can be combined with other embodiments described herein, one or more of the carrier return chambers 1410 can include one or more maintenance access ports 1420. For example, a carrier return chamber 1410 having a maintenance access port can be connected to the adjacent carrier return chambers via gate valves 1405. Accordingly, the gate valves can be closed and the carrier return chamber having the maintenance access port(s) can be vented and opened to have access to the carriers. This can be used for the loading and the unloading of carriers, e.g. for maintenance, such as cleaning.

Yet a further implementation of a manufacturing system 1000 can be described with respect to FIGS. 15A and 15B. Similar to FIG. 14, an in-line deposition system portion is provided. However, a carrier return path chamber 1510 is provided below the vacuum chambers 110 of that deposition apparatuses 200. The carrier return path chamber 1510 has horizontally extending enclosure 1512, wherein the carriers can be transferred back from the further vacuum swing module 1161 to the vacuum swing module 1160 while being horizontally oriented.

Figure 16:
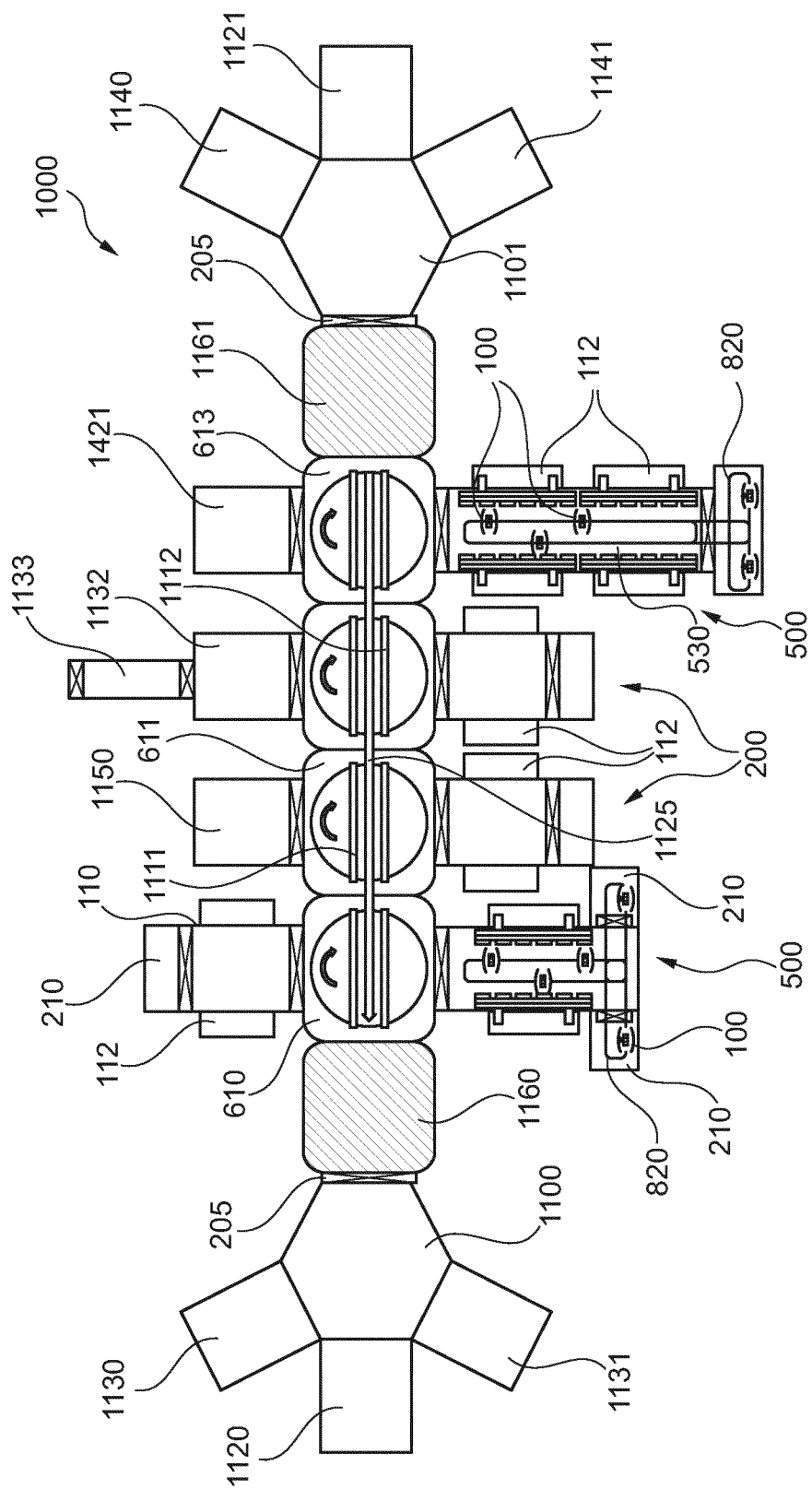
FIG. 16 shows a yet further manufacturing system, wherein deposition apparatuses having a looped track and/or a source-train configuration and deposition apparatuses having a linearly moving and rotatable evaporation source are combined.

According to yet further embodiments, a manufacturing system 1000 can additionally or alternatively be modified as explained with respect to FIG. 16. FIG. 16 shows a manufacturing system 1000 with a cluster deposition system portion similar to FIG. 11. Two or more transfer chambers, for example a first transfer chamber 610, a second transfer chamber 611, a third transfer chamber 612 and a fourth transfer chamber 613, as shown in FIG. 16, can be provided in one line having a dual track transportation arrangement with a first track 1111 and a second track 1112. According to some embodiments, a carrier return track 1125 is provided between the first track 1111 and the second track 1112.

Manufacturing systems 1000 described with respect to FIG. 16 have several deposition chambers or deposition apparatuses connected to one of the transfer chambers 610-613. FIG. 11 illustrated a plurality of deposition apparatuses 200 and according to any of the embodiments described with respect to FIGS. 1A to 4B and 6. Further embodiments, as exemplarily illustrated in FIG. 16, can include one or more deposition apparatuses 500, embodiments of which are described with respect to FIGS. 5A, 5B, and 8A to 9. According to yet further embodiments, a manufacturing system may include one or more deposition apparatuses, which are all provided according to embodiments, which are described with respect to FIGS. 5A, 5B, and 8A to 9.

In such a deposition apparatus 500, based upon the looped track, a train of sources can move with a translational movement along a substrate, which is typically masked by a mask. A curved portion of the looped track provides a rotation of an evaporation source 100. Further, the curved portion can provide for positioning the evaporation source in front of a second substrate. A further straight portion of the looped track provides a further translational movement along the further substrate. As mentioned above, according to some embodiments, which can be combined with other embodiments described herein, the substrates and the masks remain essentially stationary during deposition. The evaporation sources providing line sources, e.g. line sources with an essentially vertical orientation of the line, are moved along the stationary substrates. Embodiments having a train of evaporation sources and/or embodiments having a looped track for a translational and rotational movement of evaporation sources can benefit from having more than 2 substrates provided in the vacuum chamber.

For example, the deposition apparatus 500 connected to the further transfer chamber 613 is configured for OLED material deposition on four substrates, while a plurality of evaporation sources 100 move along the looped track 530. Further, a looped track 820 can be provided in the maintenance vacuum chamber for maintenance of the evaporation sources. The deposition apparatus 500 connected to the transfer chamber 610 is configured for OLED material deposition on two substrates. Similarly, a plurality of evaporation sources can be moved along the looped track for providing a translational and rotational movement. Further implementations or modifications of other train-like deposition source apparatuses can be provided according to the other embodiments described herein.

Figure 17:
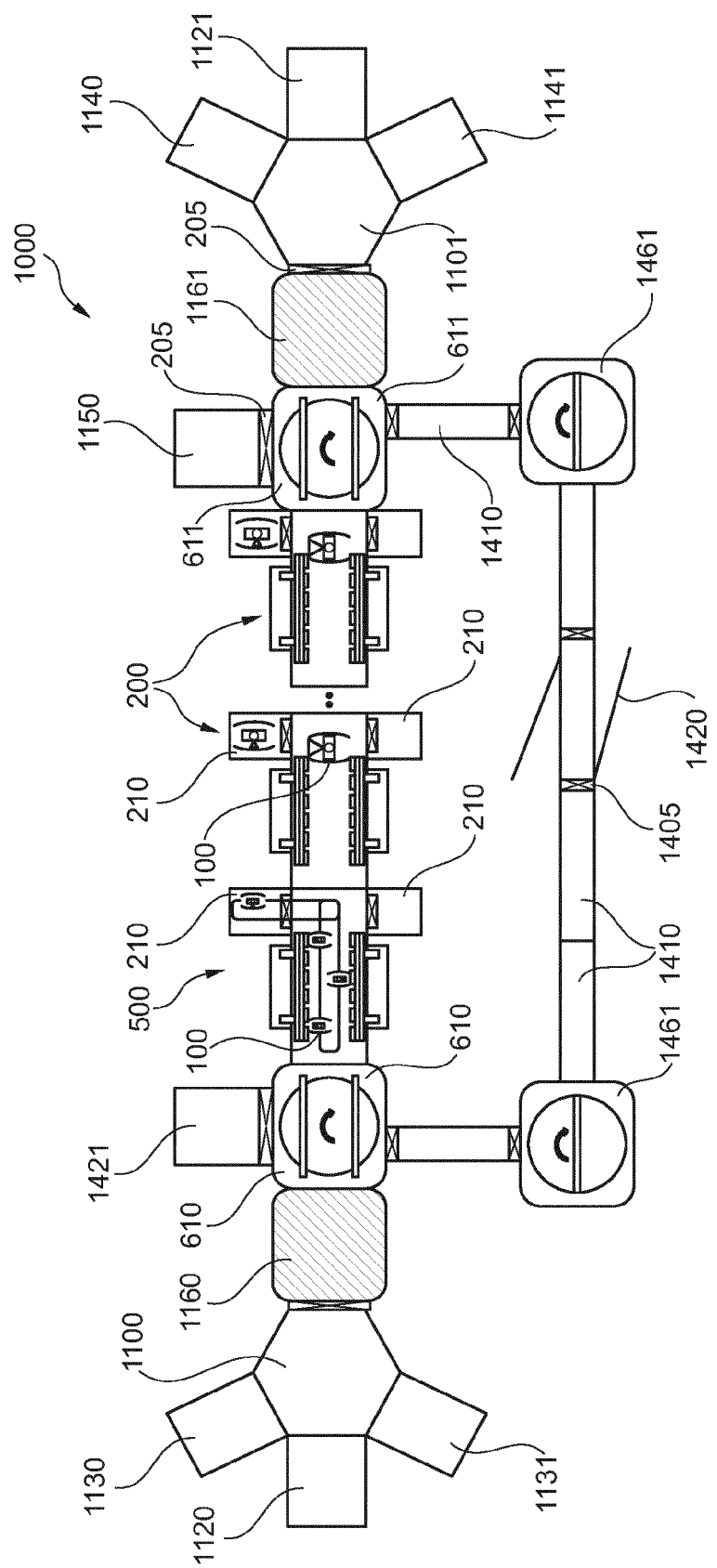
FIG. 17 shows a yet further manufacturing system, wherein deposition apparatuses having a looped track and/or a source-train configuration and deposition apparatuses having a linearly moving and rotatable evaporation source are combined.

Yet further embodiments of manufacturing systems, which are exemplarily described with respect to the manufacturing system 1000 shown in FIG. 17, can include an in-line deposition system portion as previously described with respect to FIG. 14, wherein the deposition apparatus 500 includes a train-configuration of sources having a looped track as one or more deposition chambers provided in the in-line deposition system portion.

The deposition apparatus 500 or that respective deposition chamber is connected to the transfer chamber 610 or to another deposition apparatus. The deposition apparatus 500 includes the looped track, i.e. a source-train configuration, wherein exemplarily three sources 100 move along a stationary substrate, for example a stationary substrate, which is mask by stationary mask. The evaporation source 100 is provided in the vacuum chamber 110 on a track or linear guide 220. The linear guide 220 is configured for the translational movement of the evaporation source 100. Thereafter, one or more further deposition apparatuses 200, two are shown in FIG. 17, are provided to transport the carriers from one deposition apparatus to an adjacent deposition apparatus in an in-line deposition system portion. Thereby, the further deposition apparatuses 200 have an evaporation source 100, which is provided in the vacuum chamber 110 on a track or linear guide 220. The linear guide 220 is configured for the translational movement of the evaporation source 100. Further, a rotational movement of the evaporation source can be provided by a motor or another means for rotating the evaporation source. The deposition apparatuses 500 and 200, which are shown in FIG. 17, can each deposit material onto substrates. The two substrates can be transported along a dual track transportation system from the transfer chamber 610 to the further transfer chamber 611. According to yet further embodiments, a manufacturing system may include one or more deposition apparatuses, which are all provided according to embodiments, which are described with respect to FIGS. 5A, 5B, and 8A to 9

Accordingly, FIG. 17 shows the manufacturing system 1000 having the previously described cluster portion with the substrate handling chamber 1100, wherein the substrate is handled in an horizontal orientation, a vacuum swing module 1160, the first transfer chamber and a second transfer chamber, a plurality of deposition apparatuses between the first transfer chamber and the second transfer chamber, a further vacuum swing module 1161 and a cluster portion with substrate handling chamber 1101, in which the substrate is handled in an horizontal orientation. Further, a carrier return track is provided by a plurality of carrier return chambers 1410 and one or more vacuum rotation modules 1461, as previously described. Further details, aspects, features of various embodiments, which can be provided as a modification of the manufacturing system 1000 shown in FIG. 17, can be yielded by the implementations of other embodiments, which have previously been described.

Figure 18:
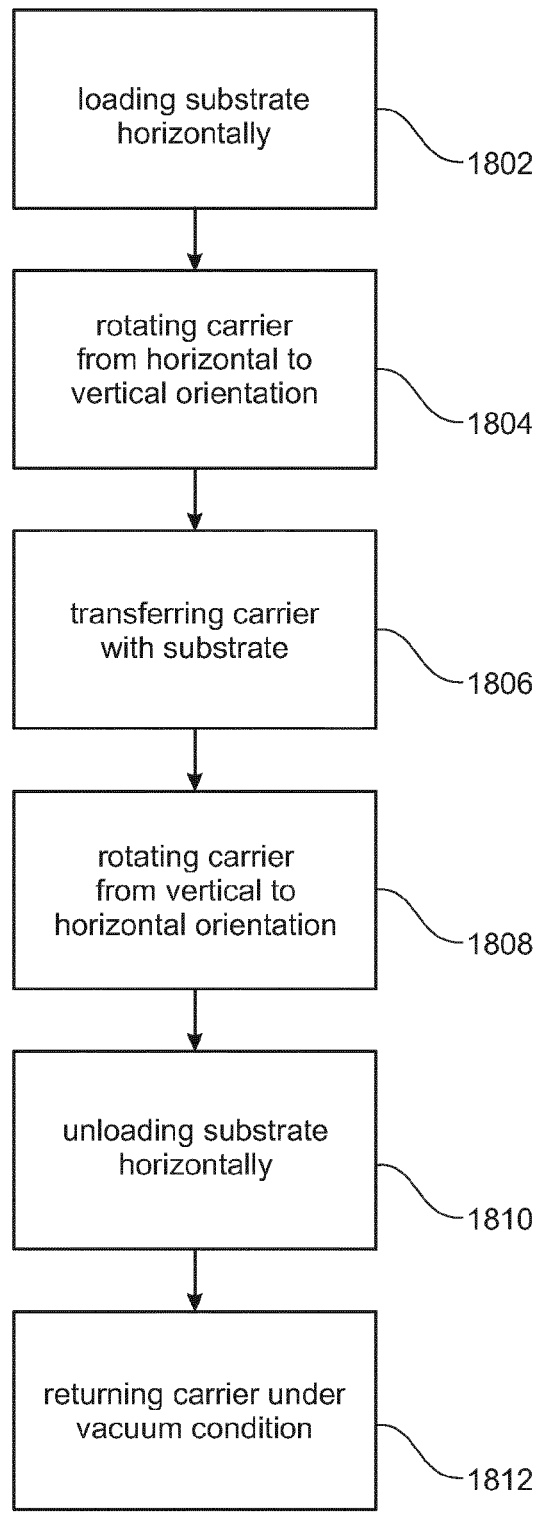
FIG. 18 shows a flowchart illustrating methods of operation a manufacturing system according to embodiments described herein.

FIG. 18 illustrates a flow chart of an embodiment of operating manufacturing device according to embodiments described herein. A substrate is loaded into the manufacturing system in a horizontal orientation (see step 1802). The substrate can be loaded on a carrier the horizontal orientation and is rotated by rotating the carrier from the horizontal orientation perverted orientation in step 1804. In step 1806, the substrate is transferred—by transferring the carrier with the substrate in the vertical orientation—through the manufacturing system, i.e. one or more deposition or processing chambers. Thereafter, the carrier having the substrate thereon is rotated from the vertical orientation to the horizontal orientation in step 1808. The substrate is unloaded in the horizontal orientation in step 1810. In step 1812, the carrier is returned under vacuum condition and/or at defined gas atmosphere, for example a defined or controller inert atmosphere in one or more chambers having argon, nitrogen, or combinations thereof provided in the chamber. For example, an inert atmosphere contains inert gases. An inert atmosphere contains reactive gases, such as oxygen or moisture, with a concentration of 10 ppm or below, e.g. 1 ppm or below.

In light of the above, the embodiments described herein can provide a plurality of improvements, particularly at least one or more of the below mentioned improvements. A "random" access to all chambers can be provided for such systems using a vertical cluster approach, i.e. systems having a cluster deposition system portion. The system concepts can be implemented for both RGB and White on CF deposition by offering flexibility in adding the number of modules, i.e. deposition apparatuses. This flexibility could also be used to create redundancy. A high system uptime can be provided by a reduced or no need to vent the substrate handling or deposition chambers during routine maintenance or during mask exchange. Mask cleaning can be provided, either in-situ by optional plasma cleaning or external by offering a mask exchange interface. A high deposition source efficiency (>85%) and a high material utilization (>50%) can be provided using a scanning source approach with 180° turning mechanism to coat 2 or more substrates alternatingly or simultaneously (source-train configuration) in one vacuum chamber. The carrier stays in vacuum or under a controlled gas environment due to an integrated carrier return track. Maintenance and pre-conditioning of the deposition sources can be provided in separate maintenance vacuum chambers or source storage chambers. A horizontal glass handling, e.g. horizontal atmospheric glass handling, can be more easily adapted using already existing glass handling equipment of an owner of a manufacturing system by implementing a vacuum swing module. An interface to a vacuum encapsulation system can be provided. There is a high flexibility to add modules for substrate inspection (on-line layer analysis), mask or carrier storage. The systems have a small footprint. Further, good scalability for current and future glass sizes can be provided.

While the foregoing is directed to embodiments of the invention, other and further embodiments of the invention may be devised without departing from the basic scope thereof, and the scope thereof is determined by the claims that follow.

The invention claimed is:

1. A system for depositing one or more layers, on a substrate supported by a carrier, the system comprising:
   a first load lock chamber;
   a first transfer chamber;
   a first vacuum substrate orientation chamber between the first load lock chamber and the first transfer chamber;
   a first swing module fixedly disposed in the first vacuum substrate orientation chamber, wherein the first swing module is configured to load a substrate onto a carrier in an essentially horizontal orientation and to change the orientation of the substrate and the carrier from the essentially horizontal orientation to a vertical orientation or to an orientation deviating from the vertical orientation by 10° or less;
   at least one vacuum deposition chamber wherein the at least one vacuum deposition chamber is connected to the first transfer chamber;
   a second load lock chamber;
   a second transfer chamber;
   a second vacuum substrate orientation chamber between the second load lock chamber and the second transfer chamber;
   a substrate transportation system configured to transport the carrier, and a substrate thereon, between the first swing module in the first vacuum substrate orientation chamber and the second vacuum orientation chamber;
   a second swing module fixedly disposed in the second vacuum substrate orientation chamber, wherein the second swing module is configured to change the orientation of a substrate and a carrier from a vertical orientation or an orientation deviating from the vertical orientation by 10° or less to an essentially horizontal orientation and to unload the essentially horizontal substrate from the carrier; and
   a carrier return track extending from the second vacuum substrate orientation chamber to the first vacuum substrate orientation chamber.

2. The system according to claim 1, wherein the first transfer chamber and the second transfer chamber are configured for essentially vertical substrate transportation therethrough.

3. The system according to claim 1, wherein the first load lock chamber is configured for essentially horizontal substrate handling.

4. The system according to claim 1, wherein the substrate transportation system further includes at least two linear substrate transportation paths, and wherein the at least one vacuum deposition chamber includes at least a first deposition chamber and a second deposition chamber each connected to a respective one of the first transfer chamber and the second transfer chamber.

5. The system according to claim 1, further comprising one or more of the chambers selected from the group consisting of: a pre-treatment chamber, a layer inspection chamber, a mask shelf chamber, and a carrier buffer chamber.

6. The system according to claim 4, wherein the carrier return track is provided between the at least two linear substrate transportation paths.

7. The system according to claim 1, wherein the at least one vacuum deposition chamber is provided between the first transfer chamber and the second transfer chamber.

8. The system according to claim 1, further comprising:
a carrier return track provided in a chamber assembly connected to the first transfer chamber and the second transfer chamber and adapted to return the carriers under vacuum conditions or under a controlled inert atmosphere from the second vacuum substrate orientation chamber to the first vacuum substrate orientation chamber.

9. The system according to claim 1, wherein the at least one vacuum deposition chamber comprises:
an evaporation source, disposed in the vacuum deposition chamber, the evaporation source comprising:
an evaporation crucible; and
a distribution pipe with one or more outlets, wherein the distribution pipe is in fluid communication with the evaporation crucible and wherein the distribution pipe is rotatable around an axis during evaporation; and
wherein a portion of the carrier transportation system disposed in the vacuum deposition chamber comprises at least two transportation tracks configured to transport a substrate in a vertical orientation or in an orientation deviating from the vertical orientation by 10° or less.

10. The system according to claim 9, further comprising:
a maintenance vacuum chamber connected to the at least one vacuum deposition chamber; and
a vacuum valve disposed between the at least one vacuum deposition chamber and the maintenance vacuum chamber, wherein the evaporation source can be transferred between the at least one vacuum deposition chamber and the maintenance vacuum chamber.

11. The system according to claim 9, wherein the evaporation source further comprises:
a support coupled to the distribution pipe and a first drive configured to provide translational movement to the support and the distribution pipe.

12. The system according to claim 10, wherein the evaporation source further comprises a second drive, wherein the second drive provides rotational movement to the distribution pipe about the longitudinal axis thereof.

13. A method of depositing one or more layers in a system for depositing one or more layers on a substrate supported by a carrier, comprising:
loading the substrate into the system in an essentially horizontal orientation;
loading the essentially horizontal substrate onto the carrier, wherein the carrier is disposed on a first swing module fixedly disposed in a first substrate orientation chamber;
changing the orientation of the carrier, and the substrate loaded thereon, from the essentially horizontal orientation to a vertical orientation or to an orientation deviating from the vertical orientation by 10° or less using the first swing module;
transferring the carrier, and the substrate loaded thereon, through the deposition system including transferring the carrier, and the substrate loaded thereon, into and out of at least one deposition chamber under vacuum conditions, wherein transferring the carrier, and the substrate loaded thereon, comprises maintaining the substrate in the vertical orientation or the orientation deviating from the vertical orientation by 10° or less, and wherein the substrate remains loaded on the carrier between transferring the carrier into and out of the at least one deposition chamber;
transferring the carrier, and the substrate loaded thereon, into a second vacuum substrate orientation chamber;
changing the orientation of the carrier, and the substrate loaded thereon, from the vertical orientation or to an orientation deviating from the vertical orientation by 10° or less to an essentially horizontal orientation using a second swing module fixedly disposed in the second vacuum substrate orientation chamber;
unloading the essentially horizontal substrate from the carrier in the second vacuum substrate orientation chamber; and
returning the empty carrier under at least one of vacuum conditions and under a controlled inert atmosphere, wherein returning the empty carrier comprises transferring the empty carrier from the second vacuum substrate orientation chamber to the first vacuum substrate orientation chamber.

14. The system according to claim 1, wherein the second load lock chamber is configured for essentially horizontal substrate handling.

15. The system according to claim 1, wherein the system is a system for depositing one or more layers comprising organic materials.

16. The system according to claim 12, wherein the the second drive further provides the rotational movement to the evaporation crucible, and wherein the rotational movement is relative to the support.

17. The method of claim 13, further comprising depositing one or more layers of organic material onto the substrate.

18. The method of claim 13, wherein the system comprises:
a first load lock chamber for loading a substrate to be processed;
a first transfer chamber;
the first vacuum substrate orientation chamber between the first load lock chamber and the first transfer chamber;
the first swing module fixedly disposed in the first vacuum orientation chamber, wherein the first swing module is configured to load an essentially horizontal substrate onto a carrier and to change the orientation of the substrate and the carrier from the essentially horizontal orientation to a vertical orientation or to an orientation deviating from the vertical orientation by 10° or less;
the at least one vacuum deposition chamber, wherein the at least one vacuum deposition chamber is connected to the first transfer chamber;
a second load lock chamber for unloading a substrate that has been processed;
a second transfer chamber;
the second vacuum substrate orientation chamber between the second load lock chamber and the second transfer chamber;

the second swing module fixedly disposed in the second vacuum orientation chamber, wherein the second swing module is configured to change the orientation of a substrate and a carrier from a vertical orientation or an orientation deviating from the vertical orientation by 10° or below to an essentially horizontal orientation and to unload the essentially horizontal substrate from the carrier; and a carrier return track from the second vacuum substrate orientation chamber to the first vacuum substrate orientation chamber, wherein the carrier return track is configured to transport the carrier under at least one of a vacuum condition and a controlled inert atmosphere.

19. The system according to claim 1, wherein the at least one vacuum deposition chamber includes at least a first deposition chamber and a second deposition chamber, wherein the first deposition chamber and the second deposition chamber are each connected to the first transfer chamber, and wherein the directions of travel of a carrier into and out of the first transfer chamber from the first vacuum substrate orientation chamber are different from the directions of travel of a carrier into and out of the first deposition chamber from the first transfer chamber.

20. A system for depositing one or more layers on a substrate supported by a carrier, the system comprising:

a first load lock chamber;

a transfer chamber;

a vacuum swing module fixedly disposed between the first load lock chamber and the transfer chamber, wherein the first vacuum swing module is configured to change the orientation of a substrate from an essentially horizontal orientation to a vertical orientation, wherein the vertical orientation includes orientations deviating from the vertical orientation by 10° or less;

one or more vacuum deposition chambers connected to the transfer chamber, wherein at least one of the one or more vacuum deposition chambers comprises:
an evaporation crucible; and
a distribution pipe, having one or more openings formed in a wall thereof, wherein the distribution pipe is rotatably disposed about a longitudinal axis, and wherein the distribution pipe is fluidly coupled to the evaporation crucible;

a substrate transportation system disposed in at least one of the one or more vacuum deposition chambers, the substrate transportation system comprising at least two transportation tracks configured to transport a substrate in the vertical orientation, wherein the substrate is loaded onto a carrier, and wherein the substrate remains loaded on the carrier between transferring the carrier into and out of the one or more vacuum deposition chambers;

a second transfer chamber, wherein the first transfer chamber and the second transfer chamber are configured for essentially vertical substrate transportation;

a second load lock chamber, wherein the first load lock chamber and the second load lock chamber are configured for essentially horizontal substrate handling;

a second vacuum swing module fixedly disposed between the second transfer chamber and the second load lock chamber, wherein the second swing module is configured to change the orientation of a substrate from the vertical orientation to the essentially horizontal orientation; and a carrier return track connecting the second vacuum swing module to the first vacuum swing module, wherein the carrier return track is configured to transport an empty carrier under vacuum conditions or a controlled inert atmosphere.

* * * * *